(12) United States Patent
Ranjan et al.

(10) Patent No.: US 10,546,855 B2
(45) Date of Patent: Jan. 28, 2020

(54) INTEGRATED CIRCUIT (IC) DEVICES INCLUDING CROSS GATE CONTACTS

(71) Applicant: Samsung Electronics Co., Ltd., Suwon-si, Gyeonggi-do (KR)

(72) Inventors: Rajeev Ranjan, Hwaseong-si (KR); Deepak Sharma, Suwon-si (KR); Subhash Kuchanuri, Hwaseong-si (KR); Chul Hong Park, Seongnam-si (KR); Jae Seok Yang, Hwaseong-si (KR); Kwan Young Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 302 days.

(21) Appl. No.: 15/473,913

(22) Filed: Mar. 30, 2017

(65) Prior Publication Data

US 2018/0090492 A1    Mar. 29, 2018

(30) Foreign Application Priority Data

Sep. 28, 2016   (KR) .......................... 10-2016-0124898

(51) Int. Cl.

| | |
|---|---|
| *H01L 27/088* | (2006.01) |
| *H01L 23/528* | (2006.01) |
| *H01L 27/02* | (2006.01) |
| *H01L 29/06* | (2006.01) |
| *H01L 27/092* | (2006.01) |
| *H01L 23/522* | (2006.01) |

(52) U.S. Cl.
CPC ...... *H01L 27/0886* (2013.01); *H01L 23/5226* (2013.01); *H01L 23/5283* (2013.01); *H01L 27/0207* (2013.01); *H01L 27/0924* (2013.01); *H01L 29/0688* (2013.01)

(58) Field of Classification Search
CPC ..................... H01L 23/5226; H01L 23/52383
See application file for complete search history.

(56) References Cited

U.S. PATENT DOCUMENTS

| 8,533,641 B2 | 9/2013 | Park et al. |
| 8,788,984 B2 | 7/2014 | Park et al. |

(Continued)

FOREIGN PATENT DOCUMENTS

| JP | 2014-528649 | 10/2014 |
| KR | 10-1563051 B1 | 10/2015 |
| WO | WO 2013/052384 A1 | 4/2013 |

*Primary Examiner* — Robert K Carpenter
(74) *Attorney, Agent, or Firm* — Myers Bigel, P.A.

(57) ABSTRACT

Integrated circuit devices are provided. The IC devices may include an active region extending in a first direction, first and second gate electrodes extending in a second direction, a first impurity region in the active region adjacent a first side of the first gate electrode, a second impurity region in the active region between a second side of the first gate electrode and a first side of the second gate electrode, a third impurity region in the active region adjacent a second side of the second gate electrode, a cross gate contact electrically connecting the first and second impurity regions, a first contact electrically connected to the third impurity region, a first wire electrically connected to the cross gate contact, and a second wire electrically connected to the first contact. The first and second wires may extend only in the first direction and may be on the same line.

20 Claims, 16 Drawing Sheets

(56) References Cited

U.S. PATENT DOCUMENTS

| | | | |
|---|---|---|---|
| 9,009,641 B2 | 4/2015 | Becker et al. | |
| 9,081,931 B2 | 7/2015 | Becker et al. | |
| 9,159,724 B2 | 10/2015 | Wang et al. | |
| 9,213,792 B2 | 12/2015 | Becker et al. | |
| 9,262,573 B2 | 2/2016 | Yang et al. | |
| 9,379,027 B2 | 6/2016 | Kim | |
| 9,653,347 B1 * | 5/2017 | Leobandung | H01L 21/7682 |
| 2014/0077305 A1 | 3/2014 | Pethe et al. | |
| 2015/0048425 A1 | 2/2015 | Park et al. | |
| 2016/0162619 A1 | 6/2016 | Yang et al. | |

\* cited by examiner

FIG. 3

|    | A | B | SO | nSO | Y |
|----|---|---|----|----|---|
| L1 | 0 | 0 | 0  | 1  | 0 |
| L2 | 0 | 1 | 1  | 0  | 0 |
| L3 | 1 | 0 | 1  | 0  | 1 |
| L4 | 1 | 1 | 0  | 1  | 1 |

INTEGRATED CIRCUIT (IC) DEVICES INCLUDING CROSS GATE CONTACTS

CROSS-REFERENCE TO RELATED APPLICATION

This application claims priority under 35 U.S.C. § 119 to Korean Patent Application No. 10-2016-0124898, filed on Sep. 28, 2016, in the Korean Intellectual Property Office, the disclosure of which is incorporated by reference in its entirety.

BACKGROUND

The present disclosure relates to integrated circuit (IC) devices.

As the integration density of integrated circuit (IC) devices increases, a multi-gate transistor including a fin-shape body or a nanowire-shape body and gates extending on the fin-shape body or the nanowire-shape body has been used.

Multi-gate transistors using a three-dimensional (3D) channel may be used to scale down integrated circuit (IC) devices. Multi-gate transistors may also improve the current control capability without increasing a gate length of the multi-gate transistors. Further, multi-gate transistors may reduce a short channel effect (SCE).

Electro-migration (EM) is a phenomenon in which atoms in an electrode of wiring migrate due to carriers. If the atoms migrate, voids may be formed in the wiring, and thus, the electrical conductivity of the wiring may decrease.

As processing becomes sophisticated, standard cells having a low cell height and integrated circuit (IC) devices having high integration density and large-width power rails for reducing EM may be beneficial.

SUMMARY

Example embodiments of the present inventive concepts provide integrated circuit (IC) device (e.g., semiconductor devices) having a unidirectional wiring structure and a cross gate contact structure so as to secure sufficiently wide power rails and having a layout capable of increasing integration density.

However, example embodiments of the present inventive concepts are not limited to those set forth herein. Example embodiments of the present inventive concepts will become more apparent to one of ordinary skill in the art to which the present disclosure pertains by referencing the detailed description provided below.

According to example embodiments of the present inventive concepts, there is provided an integrated circuit (IC) device including a first active region extending in a first direction over a substrate, and first and second gate electrodes extending in a second direction and traversing the first active region. The first and second gate electrodes are spaced apart from each other. The IC device may also include a first impurity region in the first active region adjacent a first side of the first gate electrode, a second impurity region in the first active region between a second side of the first gate electrode that is opposite the first side of the first gate electrode and a first side of the second gate electrode, a third impurity region in the first active region adjacent a second side of the second gate electrode that is opposite the first side of the second gate electrode, a cross gate contact electrically connecting the first and second impurity regions and extending across the first gate electrode, a first contact electrically connected to the third impurity region, a first wire electrically connected to the cross gate contact and having a line shape extending longitudinally in the first direction, and a second wire electrically connected to the first contact and having a line shape extending longitudinally in the first direction. The first wire and the second wire may be on an imaginary line extending in the first direction.

According to example embodiments of the present inventive concepts, there is an integrated circuit (IC) device including first and second active regions extending in a first direction over a substrate and being spaced apart from each other, a first gate electrode extending in a second direction, which traverses the first direction, a first impurity region in the first active region adjacent a first side of the first gate electrode, a second impurity region in the first active region adjacent a second side of the first gate electrode that is opposite the first side of the first gate electrode, a third impurity region in the second active region adjacent the first side of the first gate electrode, and a cross gate contact electrically connecting the first and second impurity regions and extending across the first gate electrode. The cross gate contact may include a first sub-contact, which extends in the second direction and is connected to the first and third impurity regions, a second sub-contact, which is connected to the second impurity region, and a bridge pattern, which traverses in the first gate electrode and connects the first and second sub-contacts.

According to example embodiments of the present inventive concepts, an integrated circuit (IC) device may include a first active region on a substrate, and a first gate electrode and a second gate electrode traversing the first active region and extending parallel to each other. The first gate electrode may include a first side and a second side that is opposite the first side, the second gate electrode may include a third side and a fourth side that is opposite the third side, and the second side of the first gate electrode may face the third side of the second gate electrode. The IC device may also include a first source/drain region in the first active region adjacent the first side of the first gate electrode, a second source/drain region in the first active region adjacent the second side of the first gate electrode and adjacent the third side of the second gate electrode, a third source/drain region in the first active region adjacent the fourth side of the second gate electrode, an interlayer dielectric layer on the first and second gate electrodes and the first, second and third source/drain regions, a first contact extending through the interlayer dielectric layer and being electrically connected to the first source/drain region, and a cross gate contact electrically connected to both the second source/drain region and the third source/drain region. An upper surface of the cross gate contact may be coplanar with an upper surface of the first contact.

BRIEF DESCRIPTION OF THE DRAWINGS

The above and other example embodiments and features of the present inventive concepts will become more apparent by describing in detail example embodiments thereof with reference to the attached drawings, in which:

FIG. 3 is a table explaining an operation of a semiconductor device according to example embodiments of the present inventive concepts;

DETAILED DESCRIPTION

It will be understood that references herein to "surfaces of an element A and an element B being in the same plane" (or similar language) means that the surfaces of the elements A and B are coplanar and spaced apart from a reference plane (e.g., an upper surface of a substrate) by an equal distance.

It will be also understood that references herein to "wires being on the same plane" (or similar language) means that the wires are spaced apart from a reference plane (e.g., an upper surface of a substrate) by an equal distance.

Integrated circuit (IC) devices (e.g., semiconductor devices) according to some example embodiments of the present inventive concepts will hereinafter be described with reference to FIGS. 1 through 17.

Figure 1:
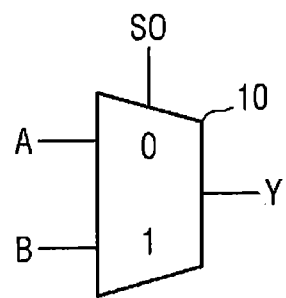
FIG. 1 is a block diagram of a semiconductor device according to example embodiments of the present inventive concepts.
Figure 2:
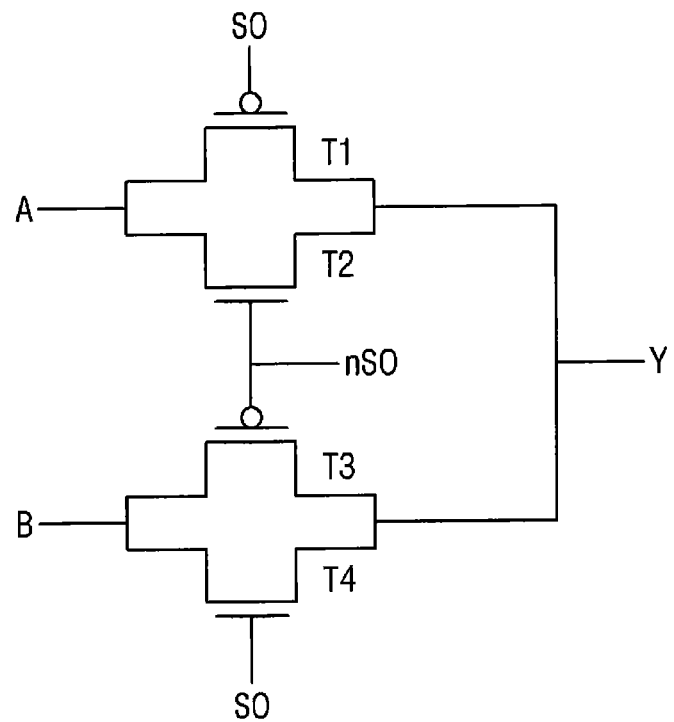
FIG. 2 is a circuit diagram of a semiconductor device according to example embodiments of the present inventive concepts.

FIG. 1 is a block diagram of a semiconductor device according to some example embodiments of the present inventive concepts. FIG. 2 is a circuit diagram of a semiconductor device according to example embodiments of the present inventive concepts. FIG. 3 is a table explaining an operation of a semiconductor device according to example embodiments of the present inventive concepts.

Referring to FIGS. 1 through 3, a semiconductor device according to some example embodiments of the present inventive concepts may include a multiplexer 10.

A multiplexer is a combinational circuit selecting one of multiple input lines and connecting the selected input line to a single output line. A multiplexer outputs single data from among multiple input data and may thus be referred to as a data selector.

More specifically, the multiplexer 10 receives a first input signal A, a second input signal B, and a selection signal S0. Then, the multiplexer 10 outputs one of the first and second input signals A and B to an output terminal Y according to the selection signal S0.

Referring to FIG. 2, a semiconductor device according to example embodiments of the present inventive concepts may include four transistors, i.e., first, second, third and fourth transistors T1, T2, T3 and T4. The first through fourth transistors T1 through T4 may collectively serve as the multiplexer 10.

More specifically, the first transistor T1 may be gated by the selection signal S0 and may be connected between a node A and a node Y. The second transistor T2 may be gated by an inverted selection signal nS0 and may be connected between the node A and the node Y. For example, the inverted selection signal nS0 may have a logic value of 1 when the selection signal S0 has a logic value of 0. In some embodiments, the first and second transistors T1 and T2 may share the same source or the same drain as illustrated in FIG. 2.

The third transistor T3 may be gated by the inverted selection signal nS0 and may be connected between a node B and the node Y. The fourth transistor T4 may be gated by the selection signal S0 and may be connected between the node B and the node Y. In some embodiments, the third and fourth transistors T3 and T4 may share the same source or the same drain as illustrated in FIG. 2.

In some embodiments, the first and third transistors T1 and T3 may be, but are not limited to, P-type metal oxide semiconductor (PMOS) transistors, and the second and fourth transistors T2 and T4 may be, but are not limited to, N-type metal oxide semiconductor (NMOS) transistors.

Referring to FIG. 3, a semiconductor device according to example embodiments of the present inventive concepts outputs data at the node A to the output terminal Y in response to the selection signal S0 having a logic value of 1 and outputs data at the node B to the output terminal Y in response to the selection signal S0 having a logic value of 0.

More specifically, referring to "L1" of the table of FIG. 3, since the selection signal S0 has a logic value of 0, a data value at the node B, i.e., a logic value of 0, is output to the output terminal Y. Referring to "L2" of the table of FIG. 3, since the selection signal S0 has a logic value of 1, a data value at the node A, i.e., a logic value of 0, is output to the output terminal Y.

Similarly, referring to "L3" of the table of FIG. 3, since the selection signal S0 has a logic value of 1, a data value at the node A, i.e., a logic value of 1, is output to the output terminal Y. Referring to "L4" of the table of FIG. 3, since the selection signal S0 has a logic value of 0, a data value at the node B, i.e., a logic value of 1, is output to the output terminal Y.

The multiplexer 10 may be used to form, for example, a latch or a flipflop, but the present inventive concepts are not limited thereto.

Figure 4:
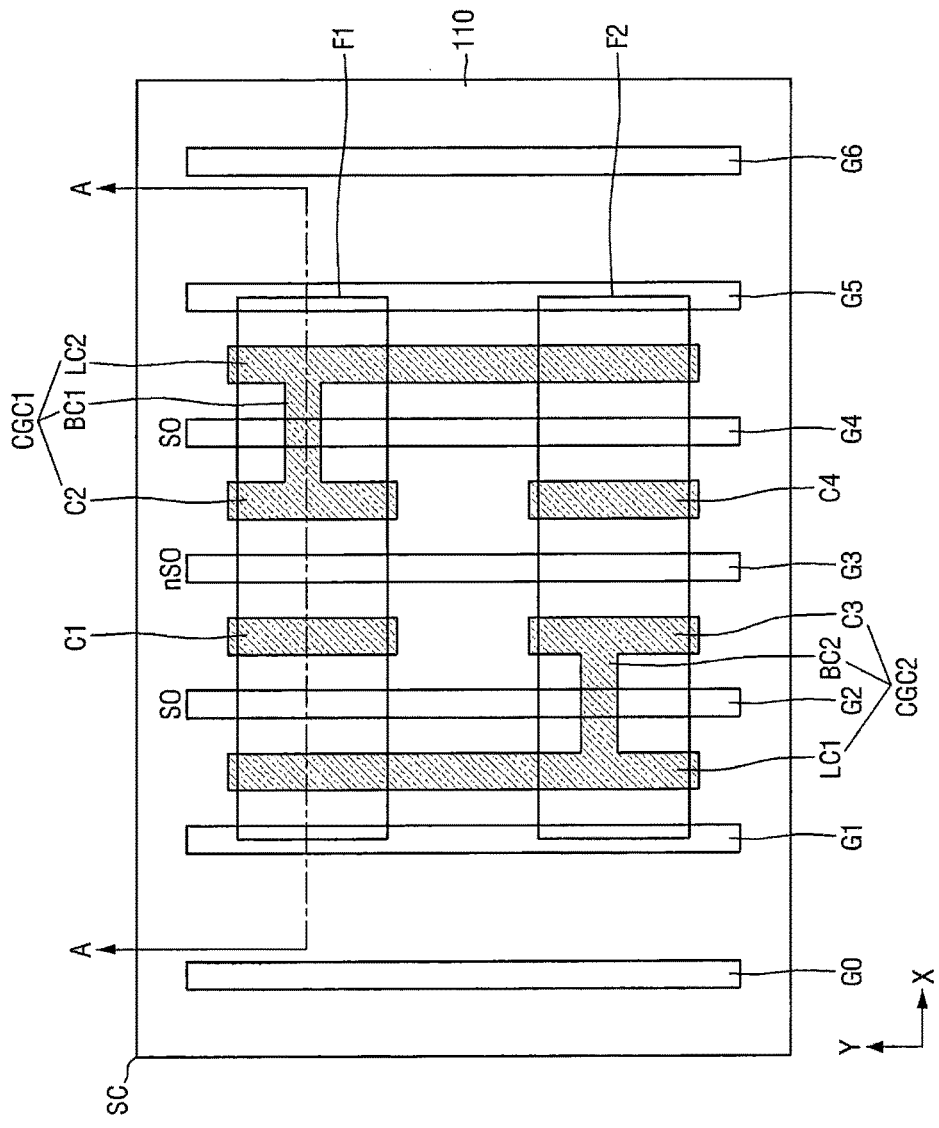
FIG. 4 is a layout view of a semiconductor device according to example embodiments of the present inventive concepts.
Figure 5:
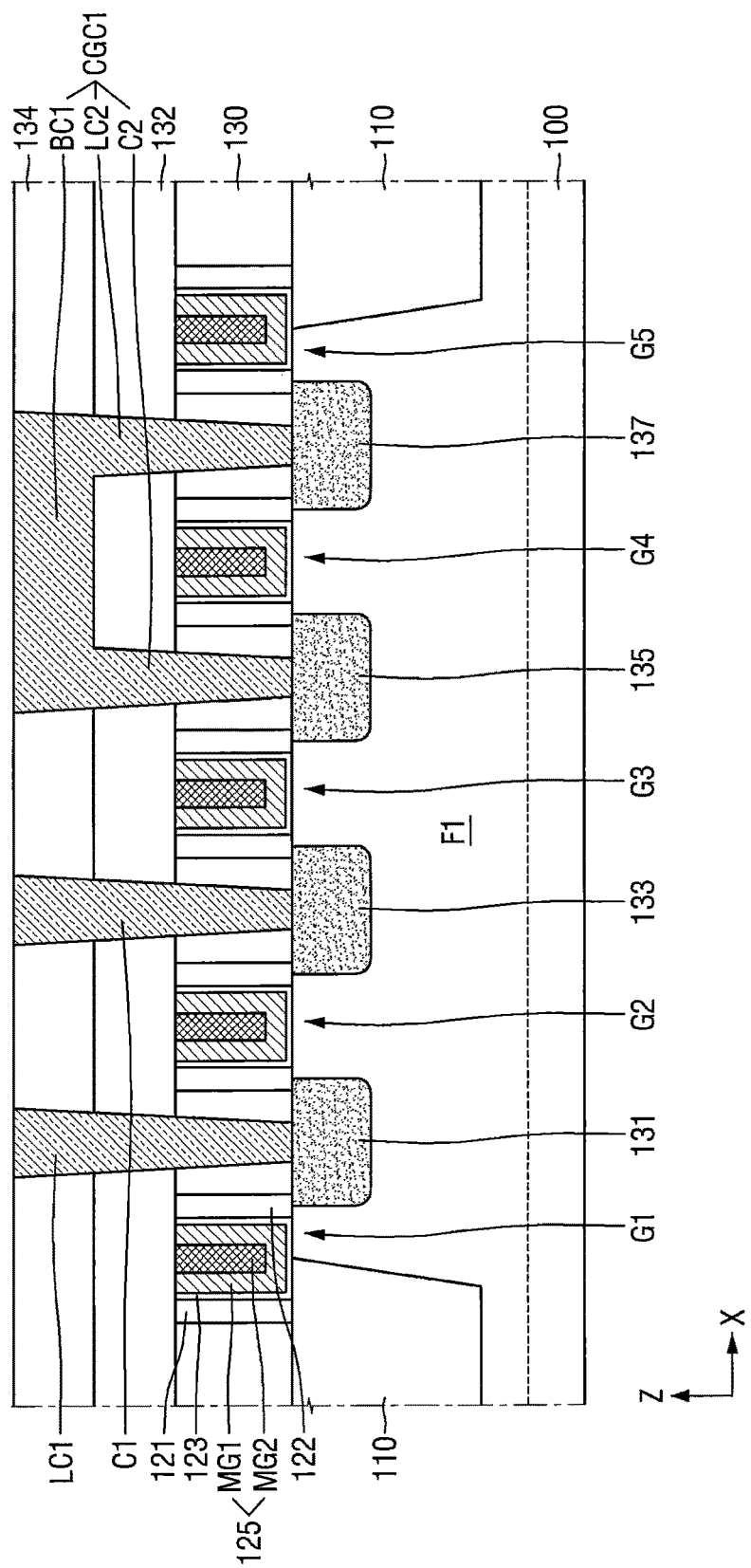
FIG. 5 is a cross-sectional view taken along the line A-A of FIG. 4.

FIG. 4 is a layout view of a semiconductor device according to example embodiments of the present inventive concepts. FIG. 5 is a cross-sectional view taken along the line A-A of FIG. 4. A semiconductor device according to example embodiments of the present inventive concepts will hereinafter be described, taking a standard cell SC of a multiplexer as an example, but the present inventive concepts are not limited thereto.

Referring to FIGS. 4 and 5, a semiconductor device according to example embodiments of the present inventive concepts may include a substrate 100, a first active region F1, a second active region F2, zeroth, first, second, third, fourth, fifth and sixth gate structures G0, G1, G2, G3, G4, G5 and G6, first, second, third, and fourth impurity regions 131, 133, 135, and 137, and isolation layer 110.

The substrate 100 may be, for example, a semiconductor substrate. The substrate 100 may comprise one of silicon (Si), strained Si, a Si alloy, silicon carbide (SiC), silicon germanium (SiGe), silicon germanium carbide (SiGeC), germanium (Ge), a Ge alloy, gallium arsenide (GaAs), indium arsenide (InAs), a III-V semiconductor, and a II-Vi semiconductor, or a combination or a stack thereof. In some embodiments, the substrate 100 may be an organic plastic substrate, rather than a semiconductor substrate. In the description that follows, it is assumed that the substrate 100 is formed of Si.

The substrate 100 may be of P-type or N-type. In some example embodiments, an insulating substrate may be used as the substrate 100. More specifically, a silicon-on-insulator (SOI) substrate may be used as the substrate 100. In the case of using an SOI substrate as the substrate 100, delays in operations of the semiconductor device may be reduced.

The first and second active regions F1 and F2 may be defined by a field insulation layer (e.g., isolation layer 110) in the substrate 100. As illustrated in FIG. 4, the first and second active regions F1 and F2 may extend longitudinally in a first direction X (i.e., a first horizontal direction). The first and second active regions F1 and F2 may be fin-type pattern or nanowire-type pattern protruding from the substrate 100. The first and second active regions F1 and F2 may comprise impurities having different types, but the present inventive concepts are not limited thereto. For example, one of the first and second active regions F1 and F2 may comprise P-type impurities, and the other one of the first and second active regions F1 and F2 may comprise N-type impurities.

The isolation layer 110 may be formed on sides of the first and second active regions F1 and F2. The isolation layer 110 may be implemented as, for example, a shallow trench isolation (STI), which has excellent isolation properties, occupies only a small area, and is thus suitable for high-density integration applications, but the present inventive concepts are not limited thereto. The isolation layer 110 may comprise, for example, at least one of silicon oxide, silicon nitride, silicon oxynitride and a combination thereof.

The zeroth through sixth gate structures G0 through G6 may extend in a second direction Y (i.e., a second horizontal direction), which intersects (e.g., traverses) the first direction X. In some embodiments, the first gate structure G1 and the second gate structure G2 may overlap with the first and second active regions F1 and F2 and the isolation layer 110 in plan view as illustrated in FIG. 4. The first and second gate structures G1 and G2 may be formed to extend in the same direction (e.g., the second direction Y).

The zeroth through sixth gate structures G0 through G6 may have substantially the same configuration. That is, the zeroth through sixth gate structures G0 through G6 may be formed by the same processes and may comprise the same materials. The zeroth through sixth gate structures G0 through G6 will hereinafter be described, taking the first gate structure G1 as an example.

The first gate structure G1 may include a gate insulating layer 123, a gate electrode 125, and spacers 121 and 122. The first gate structure G1 may be formed by, for example, a gate last process.

The gate insulating layer 123 may be disposed between the substrate 100 and the gate electrode 125. The gate insulating layer 123 may also be between the gate electrode 125 and the spacers 121 and 122. The gate insulating layer 123 may include a high-permittivity (high-k) layer. In a case in which the gate insulating layer 123 is a high-k layer, the gate insulating layer 123 may be formed of a high-k material. In some example embodiments, the high-k material may be, for example, $HfO_2$, $Al_2O_3$, $ZrO_2$, or $TaO_2$, but the present inventive concepts are not limited thereto.

Although not specifically illustrated, an interface layer (not illustrated) may be further disposed between the gate insulating layer 123 and the substrate 100 to improve a poor interface between the gate insulating layer 123 and the substrate 100. The interface layer may include a low-k material layer having a permittivity (k) of 9 or less, for example, a silicon oxide layer ($k \approx 4$) or a silicon oxynitride layer ($k \approx 4$ to 8 depending on the contents of oxygen and nitrogen atoms). In some embodiments, the interface layer may be formed of silicate or a combination of a silicon oxide layer and a silicon oxynitride layer.

The gate electrode 125 may comprise a conductive material. In some example embodiments, the gate electrode 125 may include first and second metal layers MG1 and MG2. More specifically, the gate electrode 125 may include a stack of two or more metal layers. The first metal layer MG1 may control a work function, and the second metal layer MG2 may fill the space defined by the first metal layer MG1. For example, the first metal layer MG1 may comprise at least one of TiN, TaN, TiC, and TaC, and the second metal layer MG2 may comprise tungsten (W) or aluminum (Al). In some embodiments, the gate electrode 125 may be formed of a non-metal such as Si or SiGe. The gate electrode 125 may be formed by, for example, a replacement process, but the present inventive concepts are not limited thereto.

The spacers 121 and 122 may be disposed at least one side of the gate electrode 125. In some embodiments, the spacers 121 and 122 may be disposed on both sides of the gate electrode 125, as illustrated in FIG. 5. The spacers 121 and 122 may include at least one of a nitride layer and an oxynitride layer. FIG. 5 illustrates the spacers 121 and 122 as having straight sides, but the present inventive concepts are not limited thereto. That is, the shape of the spacers 121 and 122 may be modified in various manners. For example, in some example embodiments, the spacers 121 and 122 may be curved with round outer surfaces or may be L-shaped.

The first, second, third, and fourth impurity regions 131, 133, 135, and 137 may be formed in the active region F1 between a pair of adjacent gate structures, for example, the first and second gate structures G1 and G2. For example, the first and second impurity regions 131 and 133 may be formed at or adjacent first and second sides of the second gate structure G2, respectively. The first side and the second side of the second gate structure G2 may be opposite.

In some embodiments, first impurity region 131 may be formed to contact at least a portion of the bottom surface of the first gate structure G1 or to overlap with the first gate structure G1 as illustrated in FIG. 5. That is, a portion of the bottom surface of the spacer 122 and a portion of the top surface of the first impurity region 131 may contact each other, and a portion of the first impurity region 131 may be located below the first gate structure G1. The second, third, and fourth impurity regions 133, 135, and 137 may have a similar structure to that of the first impurity region 131, but the present inventive concepts are not limited thereto.

The first, second, third, and fourth impurity regions 131, 133, 135, and 137 may be formed by an epitaxial growth process. More specifically, in some embodiments, the first, second, third, and fourth impurity regions 131, 133, 135, and 137 may comprise an element semiconductor material (e.g., silicon (Si), and germanium (Ge)). In some embodiments, the first, second, third, and fourth impurity regions 131, 133, 135, and 137 may comprise a compound semiconductor such as, for example, a IV-IV group compound semiconductor or a III-V group compound semiconductor. More specifically, the IV-IV group compound semiconductor may be, for example, a binary or ternary compound comprising at least two of carbon (C), Si, Ge, and tin (Sn) or a compound obtained by doping the binary or ternary compound with a IV group element. The III-V group compound semiconductor may be a binary, ternary, or quaternary compound obtained by combining at least one III group element selected from among Al, Ga, and In and at least one V group element selected from among phosphorus (P), arsenic (As), and antimony (Sb).

In some embodiments, the impurity regions (e.g., the first, second, third, and fourth impurity regions 131, 133, 135, and 137) of the first active region F1 may comprise a compressive stress material. For example, the compressive stress material may be a material such as SiGe having a larger lattice constant than Si. By applying compressive stress to the first active region F1, the mobility of carriers in a channel region may be improved.

In some embodiments, impurity regions of the second active region F2 may comprise a tensile stress material. For example, in a case in which the substrate 100 is formed of Si, the impurity regions of the second active region F2 may be formed of Si or a material such as SiC having a smaller lattice constant than Si.

Transistors on the first active region F1 may operate as, but are not limited to, PMOS transistors, and transistors on the second active region F2 may operate as, but are not limited to, NMOS transistors.

In some embodiments, the zeroth, first, fifth, and sixth gate structures G0, G1, G5, and G6 may be disposed on the isolation layer 110 and may operate as dummy gates.

The first and second impurity regions 131 and 133, which are disposed at or adjacent the first and second sides of the second gate structure G2, respectively, may operate as a source and a drain of the second gate structure G2. Similarly, the second and third impurity regions 133 and 135, which are disposed at or adjacent first and second sides of the third gate structure G3, respectively, may operate as a source and a drain of the third gate structure G3.

The third and fourth impurity regions 135 and 137, which are disposed at or adjacent first and second sides of the fourth gate structure G4, respectively, may be electrically connected by a cross gate contact CGC1, and thus, a portion of the fourth gate structure G4 that is on the first active region F1 may operate as a dummy gate. However, the present inventive concepts are not limited to this.

Referring to FIG. 5, a first long contact LC1 may be formed to be electrically connected to the first impurity region 131. A first contact C1 may be formed to be electrically connected to the second impurity region 133. In some example embodiments, the first long contact LC1 may be, but is not limited to, a source contact of the second gate structure G2, and the first contact C1 may be, but is not limited to, a drain contact of the second gate structure G2. In some embodiments, the first long contact LC1 may overlap both the first active region F1 and the second active region F2 in plan view, and the first contact C1 may overlap only the first active region F1 in plan view as illustrated in FIG. 4.

The first long contact LC1 and the first contact C1 may comprise a conductive material. For example, the first long contact LC1 and the first contact C1 may comprise W, but the present inventive concepts are not limited thereto. That is, in some embodiments, the first long contact LC1 and the first contact C1 may comprise at least one of, for example, polysilicon, a metal silicide compound, a conductive metal nitride, and a metal, but the present inventive concepts are not limited thereto.

The cross gate contact CGC1 may electrically connect the third and fourth impurity regions 135 and 137 and may extend across the fourth gate structure G4. More specifically, the cross gate contact CGC1 may include a first sub-contact (i.e., a second contact C2), which is connected to the third impurity region 135, a second sub-contact (i.e., a second long contact LC2), which is connected to the fourth impurity region 137, and a bridge pattern BC1, which connects the second contact C2 and the second long contact LC2. Due to the presence of the cross gate contact CGC1, electric potential may become uniform in and across the third and fourth impurity regions 135 and 137 on both sides of the gate structure G4.

The second contact C2, the second long contact LC2, and the bridge pattern BC1 may comprise the same conductive material. For example, the second contact C2, the second long contact LC2, and the bridge pattern BC1 may all comprise W, but the present inventive concepts are not limited thereto. That is, in some embodiments, the second contact C2, the second long contact LC2, and the bridge pattern BC1 may comprise at least one of, for example, polysilicon, a metal silicide compound, a conductive metal nitride, and a metal, but the present inventive concepts are not limited thereto. In some embodiments, the second long contact LC2 may overlap both the first active region F1 and the second active region F2 in plan view, and the second contact C2 may overlap only the first active region F1 in plan view as illustrated in FIG. 4.

First, second, and third interlayer dielectric layers 130, 132, and 134 may be formed on the substrate 100. The first interlayer dielectric layer 130 may be on the first, second, third, and fourth impurity regions 131, 133, 135, and 137 and the isolation layer 110 and may be disposed between two of the first through fifth gate structures G1 through G5. The top surface (e.g., the upper surface) of the first interlayer dielectric layer 130 and the top surfaces of the first through fifth gate structures G1 through G5 may be disposed in the same plane.

The second interlayer dielectric layer 132 may be formed on the first interlayer dielectric layer 130 and the first through fifth gate structures G1 through G5. In some embodiments, the second interlayer dielectric layer 132 may cover the entire first interlayer dielectric layer 130. The third interlayer dielectric layer 134 may be formed on the second interlayer dielectric layer 132 and, in some embodiments, may cover the entire second interlayer dielectric layer 132. The first, second, and third interlayer dielectric layers 130, 132, and 134 may electrically insulate elements therebelow from elements thereabove. The first, second, and third interlayer dielectric layers 130, 132, and 134 may be formed using a silicon oxide such as borosilicate glass (BSG), phosphosilicate glass (PSG), borophosphosilicate glass (BPSG), undoped silicate glass (USG), tetraethyl orthosilicate glass (TEOS), or a high density plasma-chemical vapor deposition (HDP-CVD) oxide, but the present inventive concepts are not limited thereto.

The bridge pattern BC1 may be formed on the second interlayer dielectric layer 132 to overlap with and traverse the fourth gate structure G4. The bridge pattern BC1 may electrically connect the third and fourth impurity regions 135 and 137 while being electrically insulated from the fourth gate structure G4. The bridge pattern BC1 may be formed to extend only in the first direction X. The bridge pattern BC1 may have a line shape that extends longitudinally in the first direction X. The bridge pattern BC1 may connect the second contact C2 and the second long contact LC2 via a shortest distance (e.g., a shortest path) therebetween, but the present inventive concepts are not limited thereto.

The second contact C2, the second long contact LC2, and the bridge pattern BC1 may be formed in one body with one another. In some embodiments, the second contact C2, the second long contact LC2, and the bridge pattern BC1 may have a unitary structure and may not have visible interfaces therebetween. The top surfaces of the second contact C2, the second long contact LC2, and the bridge pattern BC1 may be disposed in the same plane.

The top surfaces of the first long contact LC1, the first contact C1, the cross gate contact CGC1, and the third interlayer dielectric layer 134 may be disposed in the same plane. In some embodiments, the first contact C1, the first long contact LC1, the second contact C2, the second long contact LC2 may extend through the first, second, and third interlayer dielectric layers 130, 132, and 134 as illustrated in FIG. 5.

Referring to FIGS. 2 and 4, the selection signal S0 may be applied to the second and fourth gate structures G2 and G4, and the inverted selection signal nS0 may be applied to the third gate structure G3.

The first long contact LC1, which overlaps and connects the first and second active regions F1 and F2, is formed on the first side of the second gate structure G2. The first long contact LC1 may be formed to extend longitudinally only in the second direction Y. The first long contact LC1 may extend unidirectionally in the second direction Y on the same plane without changing directions. In some embodiments, the first long contact LC1 may have a line shape that extends longitudinally in the second direction Y as illustrated in FIG. 4. In the first active region F1, the first contact C1 is formed on the second side of the second gate structure G2, and, in the second active region F2, a third contact C3 is formed on the second side of the second gate structure G2.

A bridge pattern BC2 may connect the first long contact LC1 and the third contact C3. The bridge pattern BC2 may electrically connect impurity regions on both sides of the second gate structure G2 and may extend across the second gate structure G2. The bridge pattern BC2 may be disposed on the second active region F2 and may be formed in one body with the first long contact LC1 and the third contact C3. In some embodiments, the first long contact LC1, the third contact C3 and the bridge pattern BC2 may have a unitary structure and may not have visible interfaces therebetween. The bridge pattern BC2 may be formed to extend only in the first direction X. The bridge pattern BC2 may have a line shape that extends longitudinally in the first direction X. The bridge pattern BC2 may connect the first long contact LC1 and the third contact C3 via a shortest distance (e.g., a shortest path) therebetween.

The first long contact LC1, the third contact C3, and the bridge pattern BC2 may form a cross gate contact CGC2. The first long contact LC1 may be a first sub-pattern of the cross gate contact CGC2, and the third contact C3 may be a second sub-pattern of the cross gate contact CGC2.

The third gate structure G3 may be disposed adjacent to and may extend parallel to the second gate structure G2. In the first active region F1, the first contact C1 is disposed on the first side of the third gate structure G3, and the second contact C2 is disposed on the second side of the third gate structure G3. The first side of the third gate structure G3 may be opposite the second side of the third gate structure G3. In the second active region F2, the third contact C3 is disposed on the first side of the third gate structure G3, and a fourth contact C4 is disposed on the second side of the third gate structure G3.

The fourth gate structure G4 may be disposed adjacent to and may extend parallel to the third gate structure G3. In the first active region F1, the second contact C2 is disposed on the first side of the fourth gate structure G4, and, in the second active region F2, the fourth contact C4 is disposed on the first side of the fourth gate structure G4. The second long contact LC2 is formed on the second side of the fourth gate structure G4.

The second long contact LC2, like the first long contact LC1, overlaps and connects the first and second active regions F1 and F2 and may be formed to extend longitudinally only in the second direction Y. The bridge pattern BC1 may connect the second long contact LC2 and the second contact C2. In some embodiments, the second long contact LC2 may have a line shape that extends longitudinally in the second direction Y as illustrated in FIG. 4.

The second long contact LC2, the second contact C2, and the bridge pattern BC1 may form the cross gate contact CGC1. The second contact C2 may be the first sub-pattern of the cross gate contact CGC1, and the second long contact LC2 may be the second sub-pattern of the cross gate contact CGC1.

In the first active region F1, the second gate structure G2, the first long contact LC1, and the first contact C1 may operate as a first transistor T1, and the third gate structure G3, the first contact C1, and the second contact C2 may operate as a third transistor T3. The first and third transistors T1 and T3 may be PMOS transistors.

In the second active region F2, the third gate structure G3, the third contact C3, and the fourth contact C4 may operate as a second transistor T2, and the fourth gate structure G4, the fourth contact C4, and the second long contact LC2 may operate as a fourth transistor T4. The second and fourth transistors T12 and T14 may be NMOS transistors.

The first long contact LC1 and the cross gate contact CGC2 may be connected to the node A, and the second long contact LC2 and the cross gate contact CGC1 may be connected to the node B. The second and fourth gate structures G2 and G4 may be gated by the selection signal S0, and the third gate structure G3 may be gated by the inverted selection signal nS0. The first and fourth contacts C1 and C4 may be connected to the output terminal Y.

The semiconductor device according to some embodiments of the present inventive concepts may operate as a multiplexer.

Figure 6:
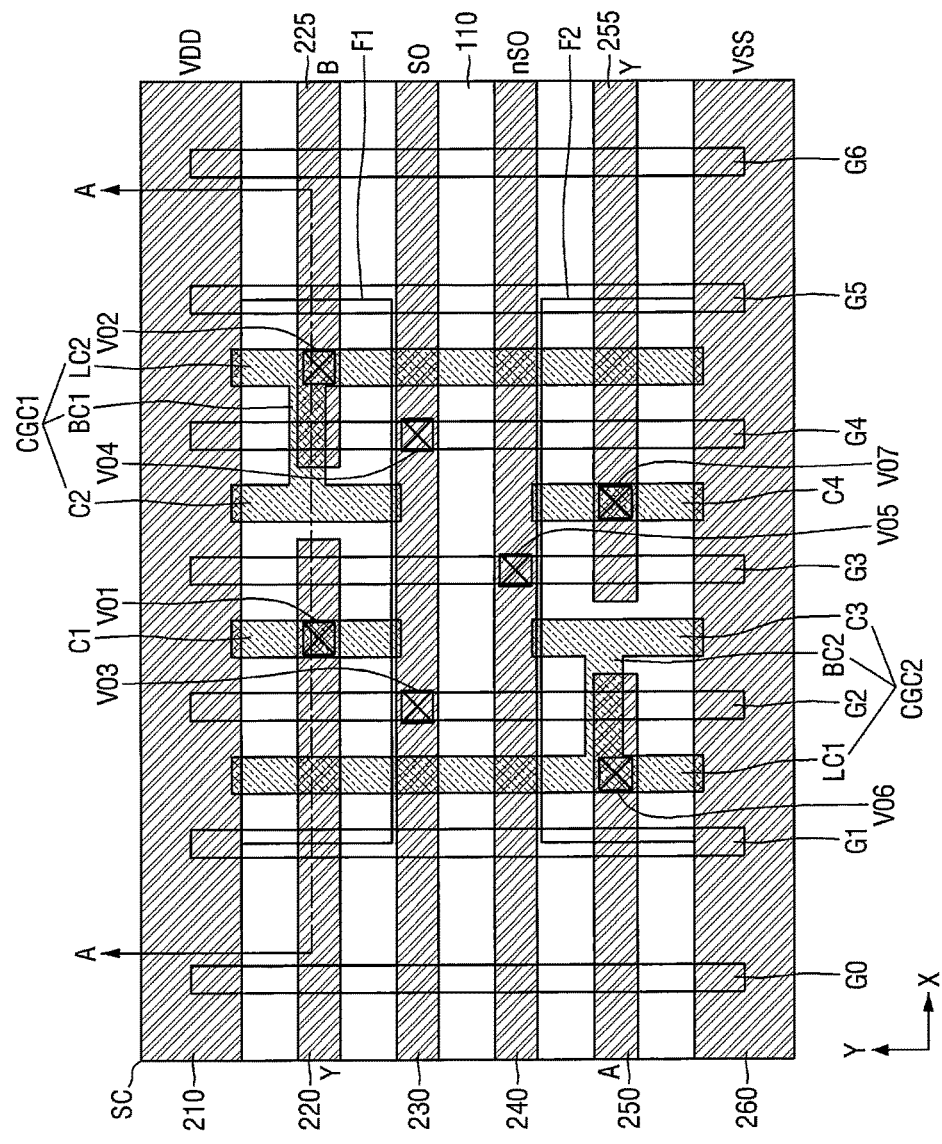
FIG. 6 is a layout view of first-stage metal wiring of a semiconductor device according to example embodiments of the present inventive concepts.
Figure 7:
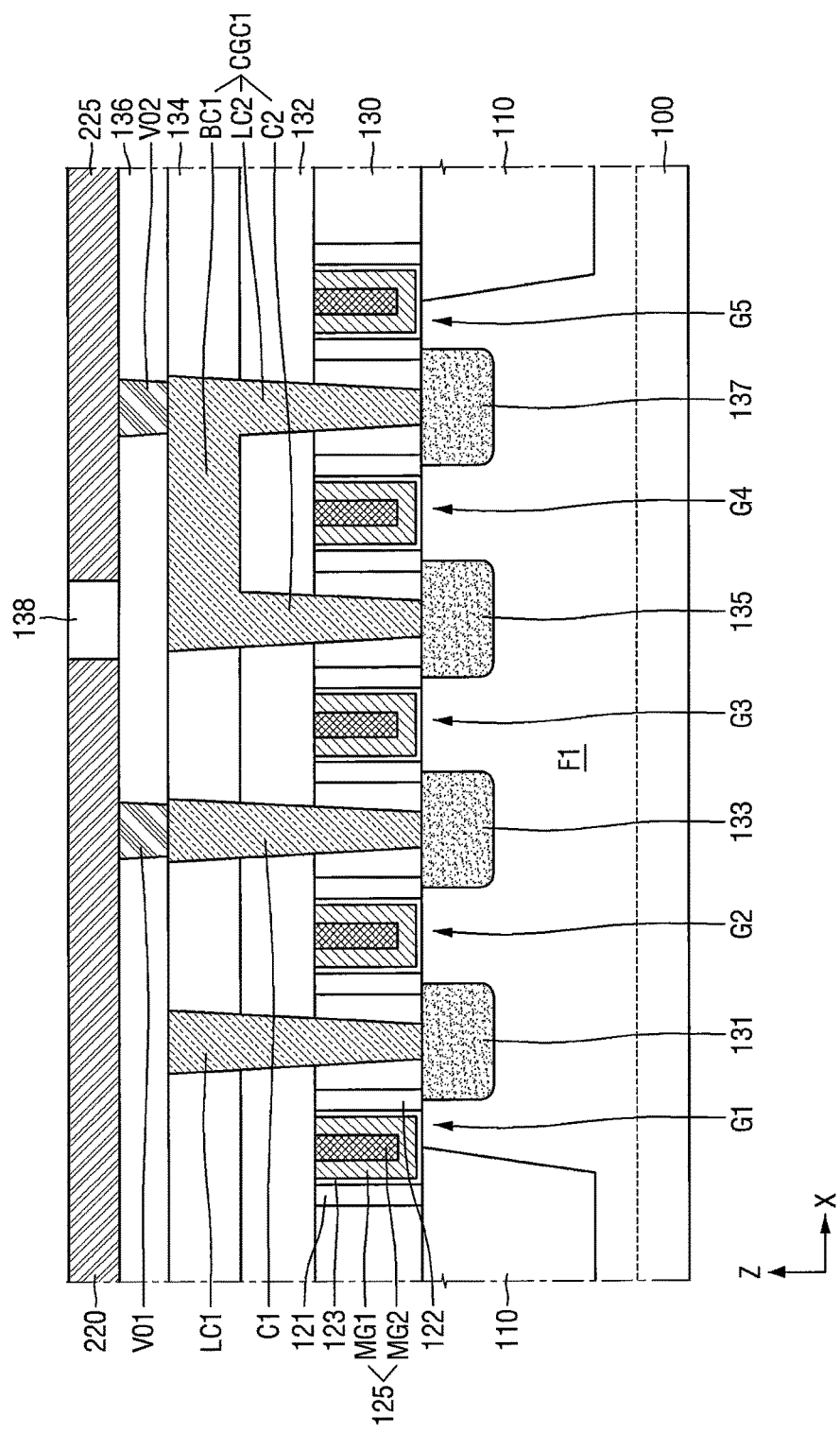
FIG. 7 is a cross-sectional view taken along the line A-A of FIG. 6.

FIG. 6 is a layout view of first-stage metal wiring of a semiconductor device according to example embodiments of the present inventive concepts. FIG. 7 is a cross-sectional view taken along the line A-A of FIG. 6.

Referring to FIGS. 6 and 7, a first wiring structure including a plurality of wires may be formed on the cross gate contacts CGC1 and CGC2 and the first through fourth contacts C1 through C4. The plurality of wires may be formed to extend unidirectionally in the first direction X and may be spaced apart from one another by the same distance in the second direction Y. The plurality of wires may be disposed on the same plane. The first wiring structure may correspond to a first level M1 at the lowermost level of the back-end-of-line (BEOL) structure of the semiconductor device according to example embodiments.

More specifically, in some embodiments, power rails 210 and 260 may be formed at the uppermost part and the lowermost part, respectively, of the standard cell SC of the multiplexer as illustrated in FIG. 6. Each of the power rails 210 and 260 may be used as VDD or VSS. In the description that follows, it is assumed that the power rail 210 at the uppermost part of the standard cell SC is used as VDD and the power rail 260 at the lowermost part of the standard cell SC is used as VSS. However, the present inventive concepts are not limited thereto.

First, second, third, and fourth wires 220, 230, 240, and 250 are sequentially arranged between the power rails 210 and 260. The first, second, third, and fourth wires 220, 230, 240, and 250 may be on a fourth interlayer dielectric layer 136. The first, second, third, and fourth wires 220, 230, 240, and 250 may be of the same scale and may be spaced apart from one another by the same distance in the second direction Y. The first, second, third, and fourth wires 220, 230, 240, and 250 may be provided as unidirectional wires extending only in the first direction X and may be arranged in parallel to one another. In some embodiments, each of the first, second, third, and fourth wires 220, 230, 240, and 250 may have a line shape (e.g., a straight line shape) that extends longitudinally in the first direction X as illustrated in FIG. 6.

The first, second, third, and fourth wires 220, 230, 240, and 250 may be formed to have the same width in the second direction Y. In some example embodiments, the width of the first, second, third, and fourth wires 220, 230, 240, and 250 in the second direction Y may be the same as the distance between two adjacent ones of the first, second, third, and fourth wires 220, 230, 240, and 250 in the second direction Y. For example, the width of the first wire 220 in the second direction Y may be the same as the distance between the first and second wires 220 and 230 in the second direction Y, but the present inventive concepts are not limited thereto. In some embodiments, the width of each of the first, second, third, and fourth wires 220, 230, 240, and 250 in the second direction Y may be uniform along the first direction X as illustrated in FIG. 6.

A fifth wire 225 may be disposed on the same line as the first wire 220 and may extend in the same direction as the first wire 220. In some embodiments, both the fifth wire 225 and the first wire 220 may be on an imaginary line that extends in the first direction X as illustrated in FIG. 6. A sixth wire 255 may be disposed on the same line as the fourth wire 250 and may extend in the same direction as the fourth wire 250. In some embodiments, both the sixth wire 255 and the fourth wire 250 may be on an imaginary line that extends in the first direction X as illustrated in FIG. 6. That is, the fifth and sixth wires 225 and 255 may be provided as unidirectional wires extending only in the first direction X and may be arranged in parallel to the first, second, third, and fourth wires 220, 230, 240, and 250. In some embodiments, each of the fifth and sixth wires 225 and 255 may have a line shape that extends longitudinally in the first direction X as illustrated in FIG. 6.

For example, the first wire 220 may be electrically connected to the first contact C1. That is, the first wire 220 may be electrically connected to the output terminal Y. For example, the second wire 230 may be electrically connected to the second and fourth gate structures G2 and G4. That is, the second wire 230 may be electrically connected to the selection signal S0. For example, the third wire 240 may be electrically connected to the third gate structure G3. That is, the third wire 240 may be electrically connected to the inverted selection signal nS0. For example, the fourth wire 250 may be electrically connected to the cross gate contact CGC2. That is, the fourth wire 250 may be electrically connected to the node A. For example, the fifth wire 225 may be electrically connected to the cross gate contact CGC1. That is, the fifth wire 225 may be electrically connected to the node B. For example, the sixth wire 255 may be electrically connected to the fourth contact C4. That is, the sixth wire 255 may be electrically connected to the output terminal Y. However, the present inventive concepts are not limited to these examples.

The wires and the contacts of the first wiring structure may be electrically connected using via contacts. For example, referring to FIG. 7, the first wire 220 may be electrically connected to the first contact C1 via a first via contact V01 that extends through the fourth interlayer dielectric layer 136, and the fifth wire 225 may be electrically connected to the cross gate contact CGC1 via a second via contact V02 that extends through the fourth interlayer dielectric layer 136. However, the present inventive concepts are not limited to this example. A fifth interlayer dielectric layer 138 may be formed on the fourth interlayer dielectric layer 136 and between the power rails 210 and 260 and the first through sixth wires 220, 230, 240, 250, 225, and 255.

In some embodiments, a third via contact V03 electrically connecting the second wire 230 to the second gate structures G2, a fourth via contact V04 electrically connecting the second wire 230 to the fourth gate structures G4 and a fifth via contact V05 electrically connecting the third wire 240 to the third gate structures G3 may be provided as illustrated in FIG. 6. In some embodiments, a sixth via contact V06 electrically connecting the fourth wire 250 to the cross gate contact CGC2 and a seventh via contact V07 electrically connecting the sixth wire 255 to the fourth contact C4 may also be provided as illustrated in FIG. 6.

In some embodiments, lowermost surfaces of the first the first wire 220 and the fifth wire 225 may be in the same plane and may directly contact the fourth interlayer dielectric layer 136, as illustrated in FIG. 7. In some embodiments, lowermost surfaces of the power rails 210 and 260 and the first through sixth wires 220, 230, 240, 250, 225, and 255 may be in the same plane.

The first wiring structure of the semiconductor device according to the present example embodiments, which includes wires extending unidirectionally and in parallel to one another, may form a standard cell with a low cell height and may secure wide power rails. Accordingly, electromigration (EM) may be reduced, the integration density of a standard cell may be increased, and thus, the semiconductor device according to example embodiments may be applicable to sophisticated processing.

Figure 8:
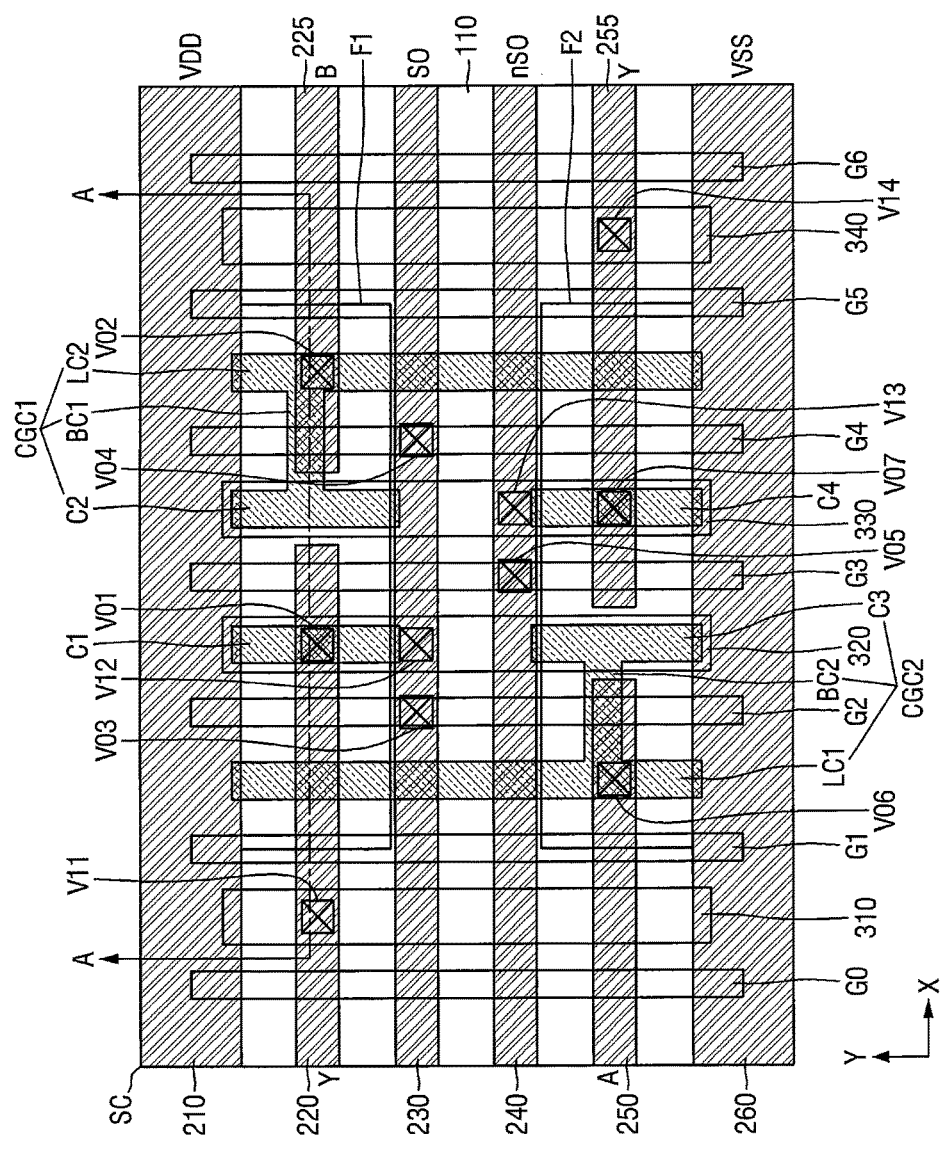
FIG. 8 is a layout view of second-stage metal wiring of a semiconductor device according to example embodiments of the present inventive concepts.
Figure 9:
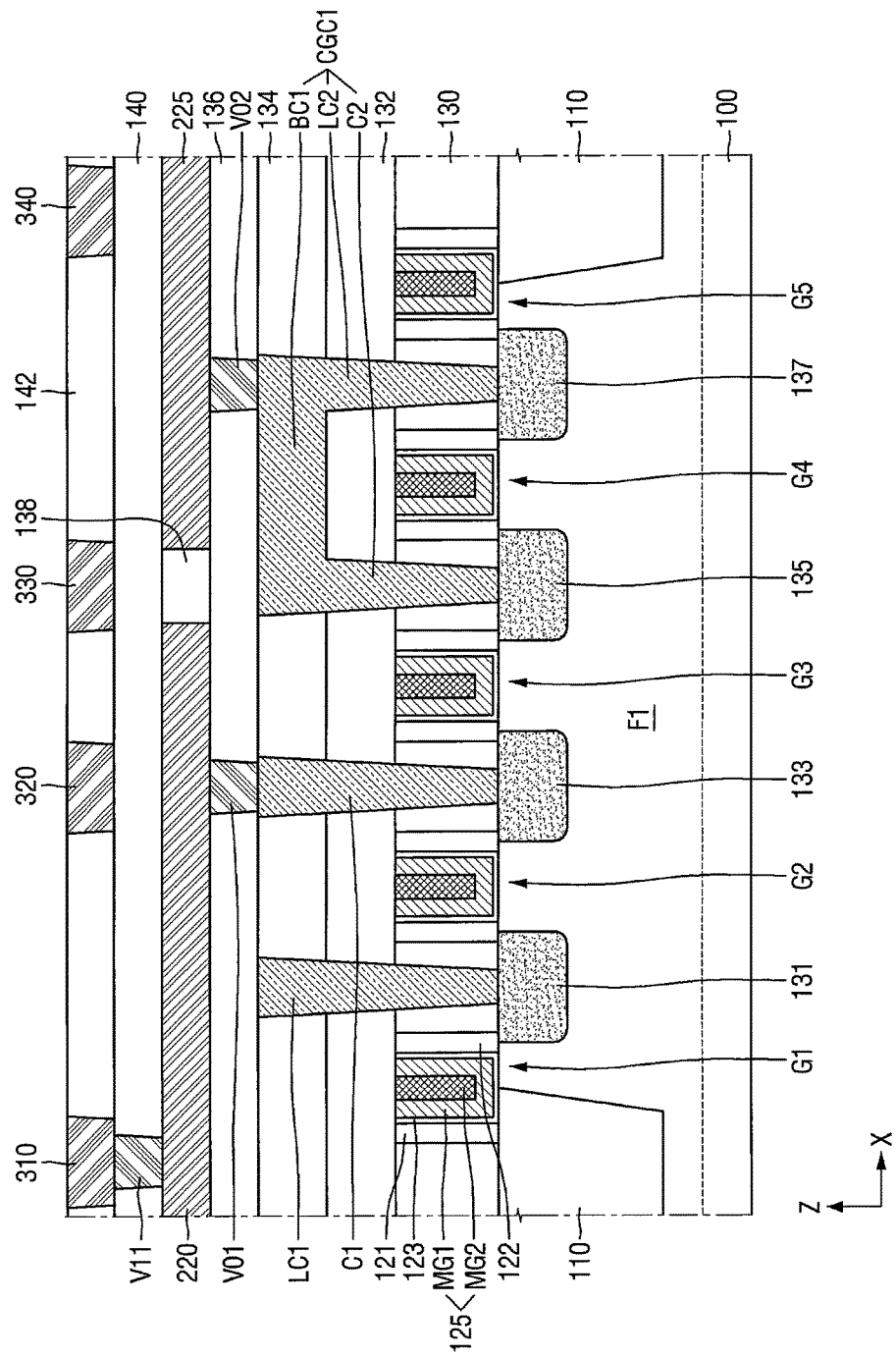
FIG. 9 is a cross-sectional view taken along the line A-A of FIG. 8.

FIG. 8 is a layout view of second-stage metal wiring of a semiconductor device according to example embodiments of the present inventive concepts. FIG. 9 is a cross-sectional view taken along the line A-A of FIG. 8.

Referring to FIGS. 8 and 9, a second wiring structure, which corresponds to a second BEOL level M2, may be formed on the first wiring structure including the power rails 210 and 260 and the first, second, third, fourth, fifth, and sixth wires 220, 230, 240, 250, 225, and 255. It will be understood that when an element or layer is referred to as being "on" another element or layer, it can be directly on the other element or layer or intervening elements or layers may be present.

More specifically, the second wiring structure may include seventh, eighth, ninth, and tenth wires 310, 320, 330, and 340. The seventh, eighth, ninth, and tenth wires 310, 320, 330, and 340 may be on a six interlayer dielectric layer 140. A seventh interlayer dielectric layer 142 may be formed between the seventh, eighth, ninth, and tenth wires 310, 320, 330, and 340. The seventh, eighth, ninth, and tenth wires 310, 320, 330, and 340 may extend unidirectionally in the second direction Y and may be arranged in parallel to one another. In some embodiments, each of the seventh, eighth, ninth, and tenth wires 310, 320, 330, and 340 has a line shape that extends longitudinally in the second direction Y as illustrated in FIG. 8. The seventh, eighth, ninth, and tenth wires 310, 320, 330, and 340 may be disposed on the same plane. In some embodiments, lowermost surfaces of the seventh, eighth, ninth, and tenth wires 310, 320, 330, and 340 may be in the same plane.

For example, the seventh wire 310 may be electrically connected to the first wire 220. That is, the seventh wire 310 may be electrically connected to the output terminal Y. For example, the eighth wire 320 may be electrically connected to the second wire 230. That is, the eighth wire 320 may be electrically connected to the selection signal S0. For example, the ninth wire 330 may be electrically connected to the third wire 240. That is, the ninth wire 330 may be electrically connected to the inverted selection signal nS0. For example, the tenth wire 340 may be electrically connected to the sixth wire 255. That is, the tenth wire 340, like the seventh wire 310, may be electrically connected to the output terminal Y. However, the present inventive concepts are not limited to these examples.

The wires and the contacts of the second wiring structure may be electrically connected using via contacts. For example, referring to FIG. 9, the seventh wire 310 may be electrically connected to the first wire 220 via an eleventh via contact V11 that extends through the six interlayer dielectric layer 140, and the first wire 220 may be electrically connected to the first contact C1 via the first via contact V01. However, the present inventive concepts are not limited to this example. In some embodiments, a twelfth via contact V12 electrically connecting the eighth wire 320 to the second wire 230, a thirteenth via contact V13 electrically connecting the ninth wire 330 to the third wire 240, a fourteenth via contact V14 electrically connecting the tenth wire 340 to the sixth wire 255 may be provided as illustrated in FIG. 8.

Figure 10:
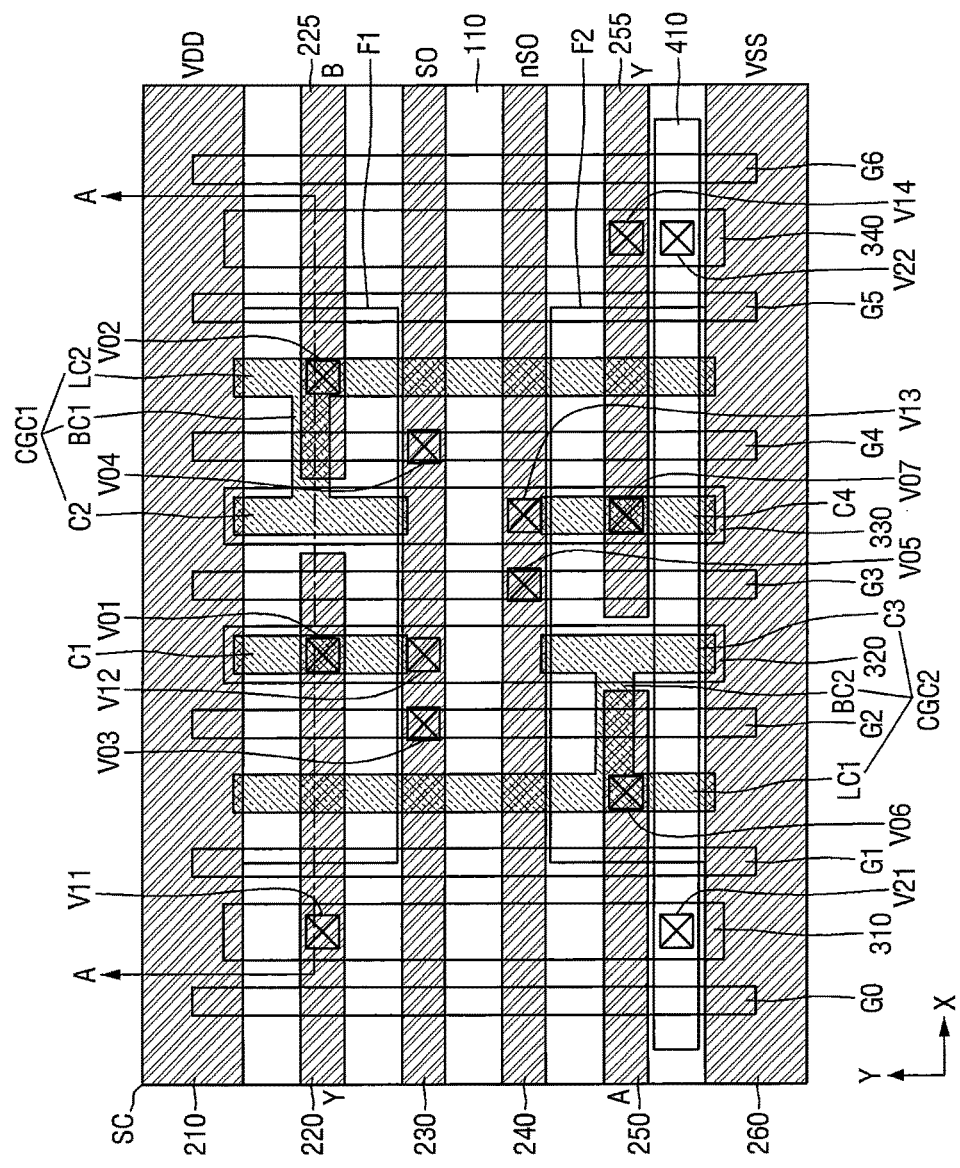
FIG. 10 is a layout view of third-stage metal wiring of a semiconductor device according to example embodiments of the present inventive concepts.

FIG. 10 is a layout view of third-stage metal wiring of a semiconductor device according to example embodiments of the present inventive concepts.

Referring to FIG. 10, a third wiring structure, which corresponds to a third BEOL level M3, may be formed on the second wiring structure.

More specifically, the third wiring structure may include an eleventh wire 410. The eleventh wire 410 may extend unidirectionally in the first direction X. In some embodiments, the eleventh wire 410 may have a line shape that extends longitudinally in the first direction X as illustrated in FIG. 10.

The eleventh wire 410 may be electrically connected to the seventh and tenth wires 310 and 340. That is, the eleventh wire 410 may be electrically connected to the output terminal Y. The wire of the third wiring structure may be electrically connected to other wires and contacts using via contacts. The eleventh wire 410 may be electrically connected to the seventh wire 310 via a twenty first via contact V21 and to the tenth wire 340 via a twenty second via contact V22. However, the present inventive concepts are not limited to this example.

Figure 11:
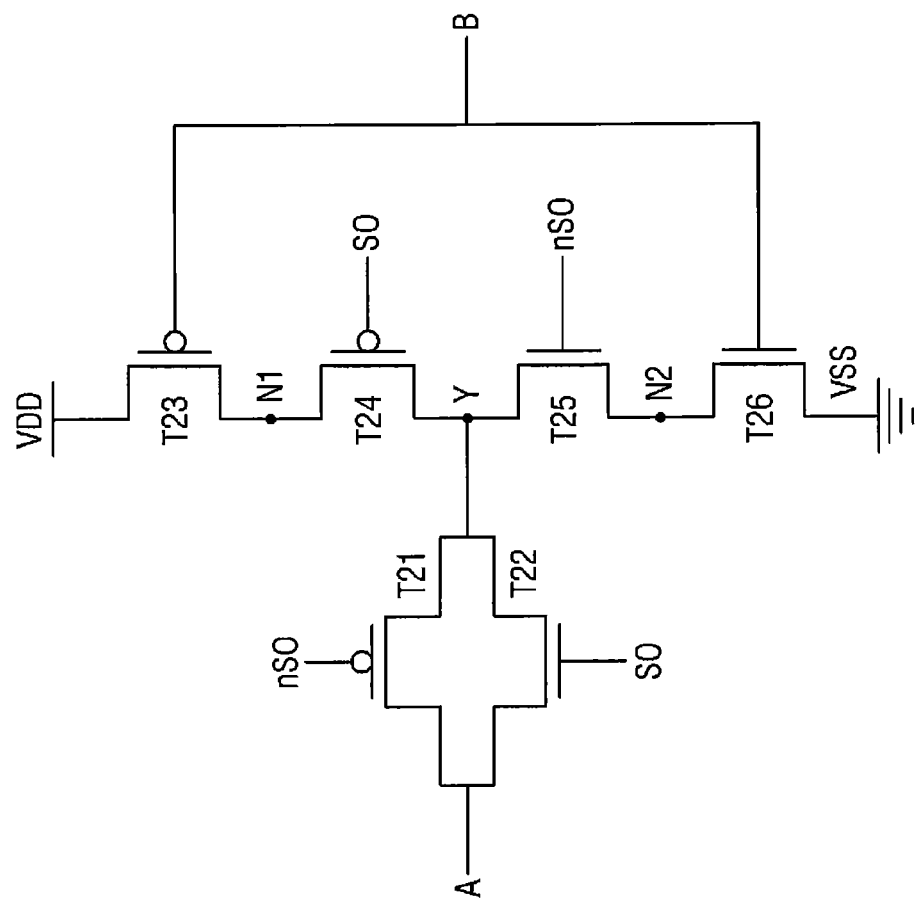
FIG. 11 is a circuit diagram of a semiconductor device according to example embodiments of the present inventive concepts.

FIG. 11 is a circuit diagram of a semiconductor device according to example embodiments of the present inventive concepts.

Referring to FIG. 11, the semiconductor device according to example embodiments may include six transistors, i.e., first, second, third, fourth, fifth and sixth transistors T21, T22, T23, T24, T25 and T26. The first through sixth transistors T21 through T26 may operate in the same manner as the multiplexer 10 that has been described above with reference to FIGS. 1 through 3.

More specifically, the first transistor T21 may be gated by an inverted selection signal nS0 and may be connected between a node A and a node Y. The second transistor T22 may be gated by a selection signal S0 and may be connected between the node A and the node Y. The first and second transistors T21 and T22 may share the same source or the same drain.

The third transistor T23 may be gated by a node B and may be connected between a node VDD and a node N1. The fourth transistor T24 may be gated by the selection signal S0 and may be connected between the node N1 and the node Y. The fifth transistor T25 may be gated by the inverted selection signal nS0 and may be connected between the node Y and a node N2. The sixth transistor T26 may be gated by the node B and may be connected between the node N2 and a node VSS. That is, the third through sixth transistors T23 through T26 may be connected in series.

The first, third, and fourth transistors T21, T23, and T24 may be, but are not limited to, PMOS transistors, and the second, fifth, and sixth transistors T22, T25, and T26 may be, but are not limited to, NMOS transistors.

The semiconductor device according to example embodiments may be used to form a latch or a flipflop, but the present inventive concepts are not limited thereto.

Figure 12:
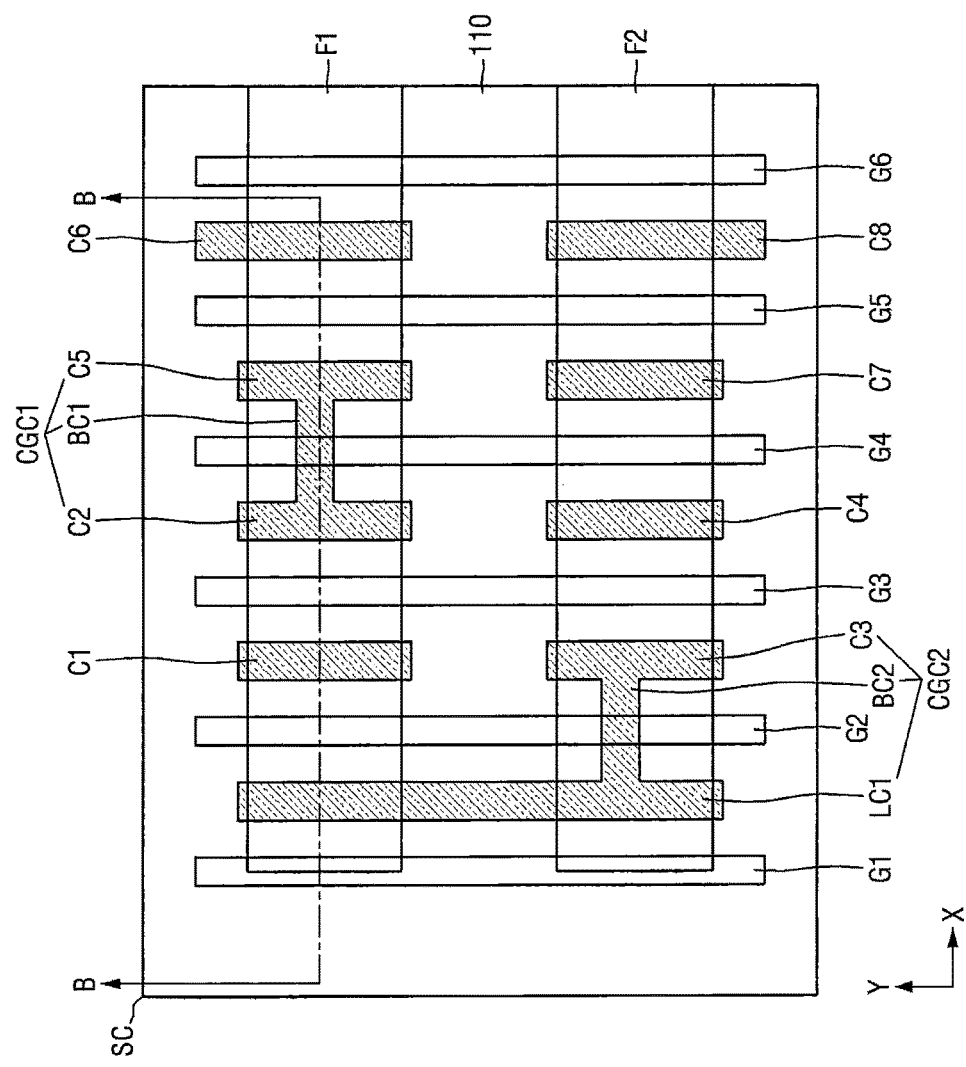
FIG. 12 is a layout view of a semiconductor device according to example embodiments of the present inventive concepts.
Figure 13:
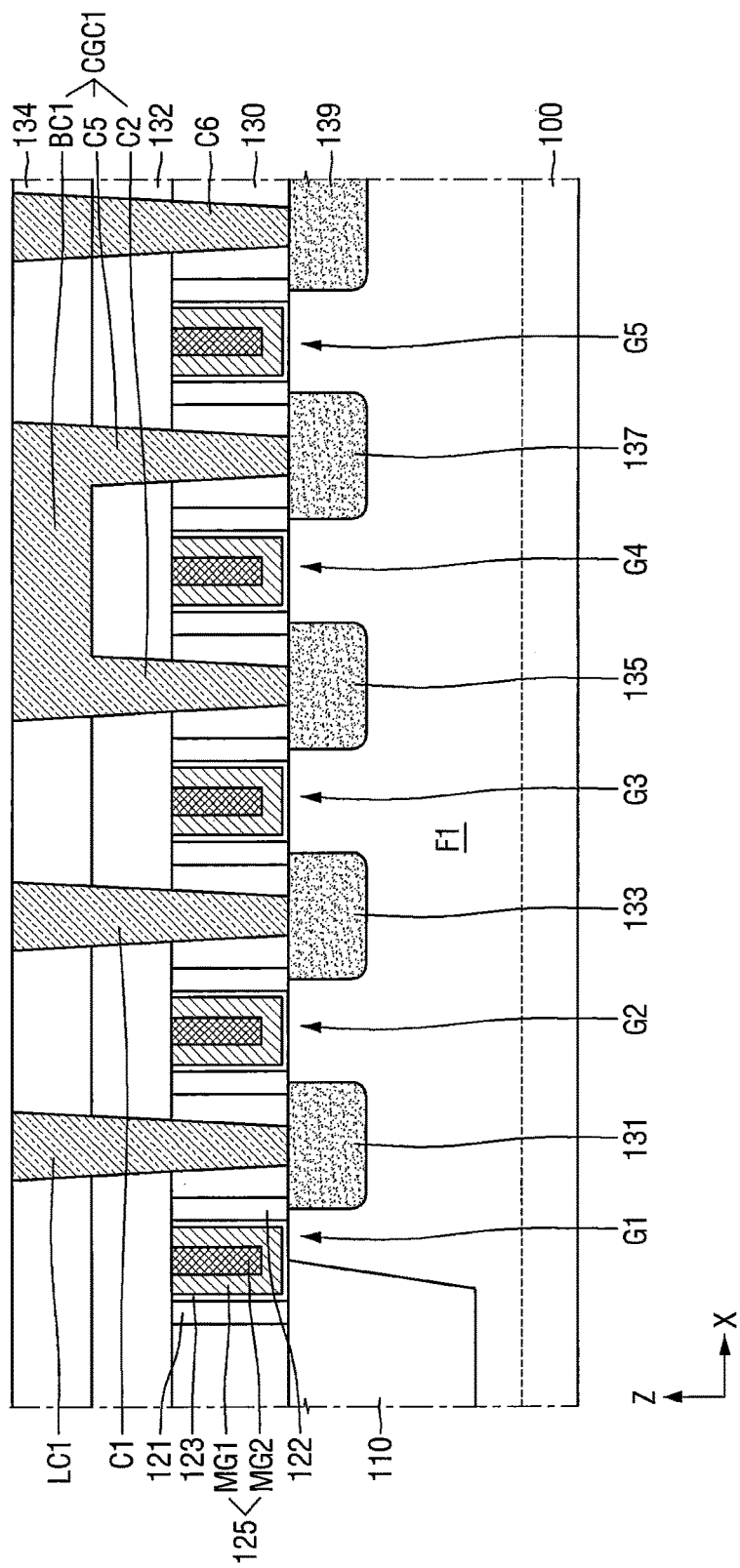
FIG. 13 is a cross-sectional view taken along the line B-B of FIG. 12.

FIG. 12 is a layout view of a semiconductor device according to example embodiments of the present inventive concepts. FIG. 13 is a cross-sectional view taken along the line B-B of FIG. 12. For convenience, the semiconductor device according to the present example embodiments will hereinafter be described, focusing mainly on differences with the semiconductor devices that was previously discussed.

Referring to FIGS. 12 and 13, the semiconductor device according to the present example embodiments may include a substrate 100, a first active region F1, a second active region F2, first, second, third, fourth, fifth and sixth gate structures G1, G2, G3, G4, G5 and G6, first, second, third, fourth, and fifth impurity regions 131, 133, 135, 137, and 139, and an isolation layer 110.

An inverted selection signal nS0 may be applied to the second and fourth gate structures G2 and G4, and a selection signal S0 may be applied to the third gate structure G3. A signal from a node B may be applied to the fifth gate structure G5. The first and sixth gate structures G1 and G6 may operate as dummy gates, but the present inventive concepts are not limited thereto.

A long contact LC1, which overlaps and connects the first and second active regions F1 and F2, may be formed at or adjacent a first side of the second gate structure G2. The long contact LC1 may be formed to extend longitudinally only in a second direction Y. The long contact LC1 may extend unidirectionally on the same plane without changing directions. In some embodiments, the long contact LC1 may have a line shape that extends longitudinally in the second direction Y as illustrated in FIG. 12.

In the first active region F1, a first contact C1 is formed on a second side of the second gate structure G2, and in the second active region F2, a third contact C3 is formed on the second side of the second gate structure G2.

A bridge pattern BC2 may connect the long contact LC1 and the third contact C3. The bridge pattern BC2 may electrically connect impurity regions on both sides of the second gate structure G2 and may extend across the second gate structure G2. The bridge pattern BC2 may be disposed on the second active region F2 and may be formed in one body with the long contact LC1 and the third contact C3. In some embodiments, the long contact LC1, the third contact C3 and the bridge pattern BC2 may have a unitary structure and may not have visible interfaces therebetween. The bridge pattern BC2 may be formed to extend only in a first direction X. The bridge pattern BC2 may connect the long contact LC1 and the third contact C3 via a shortest distance (e.g., a shortest path) therebetween.

That is, the long contact LC1, the third contact C3, and the bridge pattern BC2 may form a cross gate contact CGC2. The long contact LC1 may be a first sub-pattern of the cross gate contact CGC2, and the third contact C3 may be a second sub-pattern of the cross gate contact CGC2.

The third gate structure G3 may be disposed adjacent to and may extend parallel to the second gate structure G2. In the first active region F1, the first contact C1 is disposed on a first side of the third gate structure G3, and the second contact C2 is disposed on a second side of the third gate structure G3. In the second active region F2, the third contact C3 is disposed on the first side of the third gate structure G3, and the fourth contact C4 is disposed on the second side of the third gate structure G3.

The fourth gate structure G4 may be disposed adjacent to and may extend parallel to the third gate structure G3. In the first active region F1, the second contact C2 is disposed on a first side of the fourth gate structure G4, and the fifth contact C5 is disposed on a second side of the fourth gate structure G4. In the second active region F2, the fourth contact C4 is disposed on the first side of the fourth gate structure G4, and the seventh contact C7 is disposed on the second side of the fourth gate structure G4.

The second contact C2, the fifth contact C5, and the bridge pattern BC1 may form a cross gate contact CGC1. The bridge pattern BC1 may connect the fifth contact C5 and the second contact C2. The second contact C2 may be a first sub-pattern of the cross gate contact CGC1, and the fifth contact C5 may be a second sub-pattern of the cross gate contact CGC1.

The fifth gate structure G5 may be disposed adjacent to and may extend parallel to the fourth gate structure G4. In the first active region F1, the fifth contact C5 is disposed on a first side of the fifth gate structure G5, and the sixth contact C6 is disposed on a second side of the fifth gate structure G5. In the second active region F2, the seventh contact C7 is disposed on the first side of the fifth gate structure G5, and the eighth contact C8 is disposed on the second side of the fifth gate structure G5.

Figure 14:
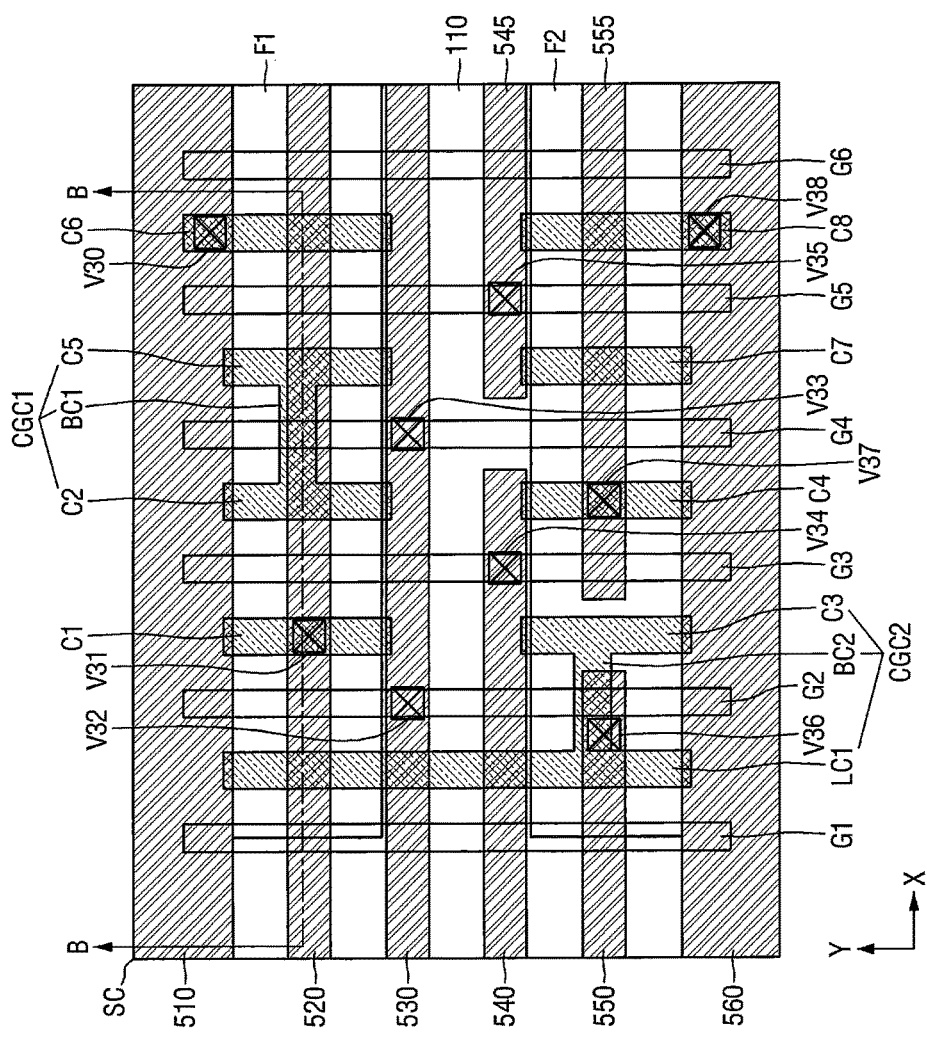
FIG. 14 is a layout view of first-stage metal wiring of a semiconductor device according to example embodiments of the present inventive concepts.

VDD and VSS may be applied to the sixth and eighth contacts C6 and C8, respectively, via power rails 510 and 560 of FIG. 14.

In the first active region F1, the second gate structure G2, the long contact LC1, and the first contact C1 may operate as a first transistor T21, the third gate structure G3, the first contact C1, and the second contact C2 may operate as a fourth transistor T24, and the fifth gate structure G5, the fifth contact C5, and the sixth contact C6 may operate as a third transistor T23. The first, third, and fourth transistors T21, T23, and T24 may be PMOS transistors.

In the second active region F2, the third gate structure G3, the third contact C3, and the fourth contact C4 may operate as a second transistor T22, the fourth gate structure G4, the fourth contact C4, and the seventh contact C7 may operate as a fifth transistor T25, and the fifth gate structure G5, the seventh contact C7, and the eighth contact C8 may operate as a sixth transistor T26. The second, fifth, and sixth transistors T22, T25, and T26 may be NMOS transistors.

The long contact LC1 and the cross gate contact CGC2 are connected to a node A, and the fifth gate structure G5 is gated by the node B. The third gate structure G3 is gated by the selection signal S0, and the second and fourth gate structures G2 and G4 are gated by the inverted selection signal nS0. The first and fourth contacts C1 and C4 may be connected to an output terminal Y.

The semiconductor device according to example embodiments may operate as a multiplexer.

Figure 15:
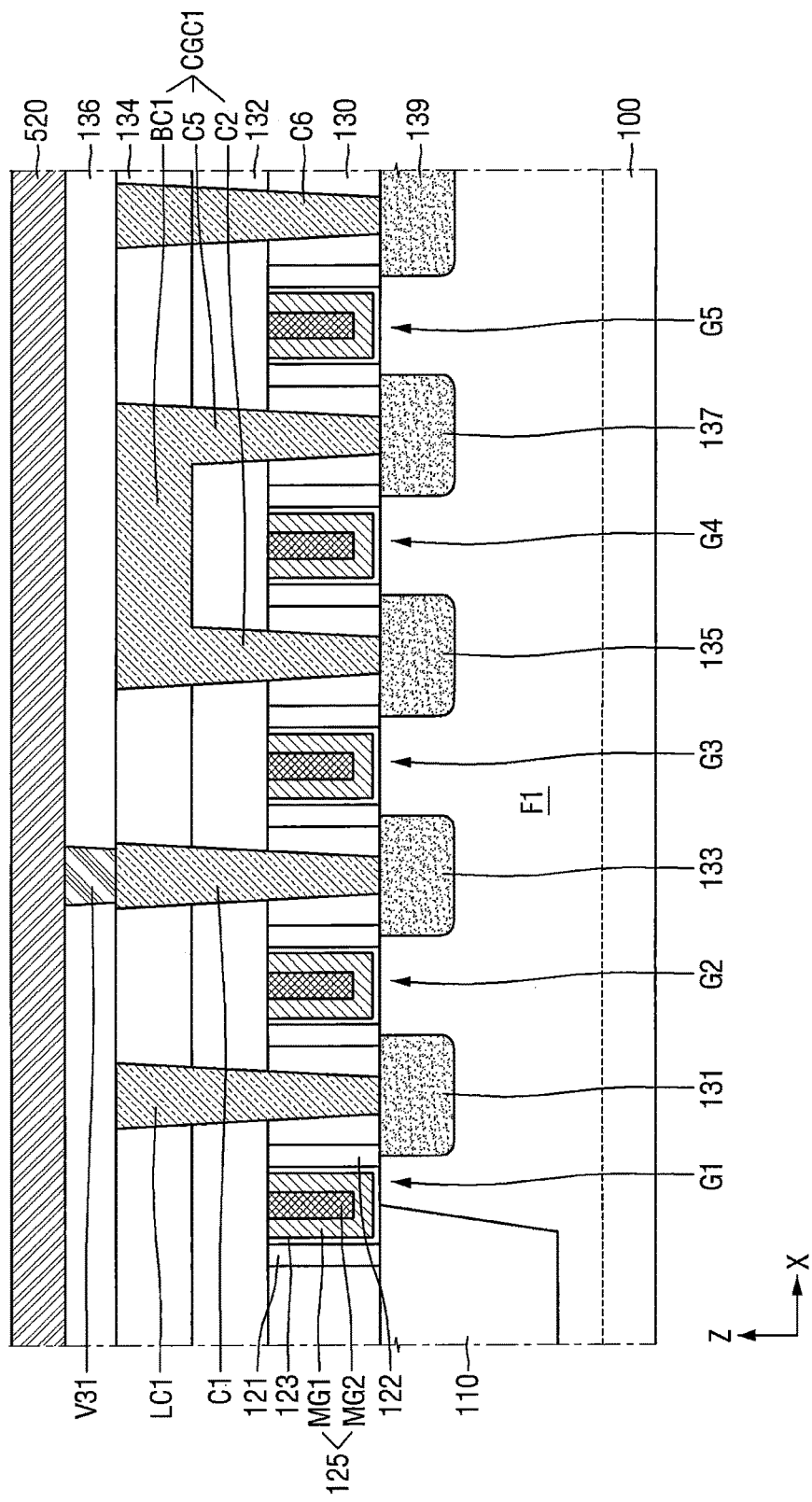
FIG. 15 is a cross-sectional view taken along the line B-B of FIG. 14.

FIG. 14 is a layout view of first-stage metal wiring of a semiconductor device according to example embodiments of the present inventive concepts. FIG. 15 is a cross-sectional view taken along the line B-B of FIG. 14.

Referring to FIGS. 14 and 15, a first wiring structure including a plurality of wires may be formed on the cross gate contacts CGC1 and CGC2 and the first through eighth contacts C1 through C8. The plurality of wires may be formed to extend unidirectionally in the first direction X and may be spaced apart from one another by the same distance (i.e., an equal interval) in the second direction Y. The plurality of wires may be disposed on the same plane. In some embodiments, lowermost surfaces of the plurality of wires may be in the same plane. The first wiring structure may correspond to a first level M1 at the lowermost level of the BEOL structure of the semiconductor device according to example embodiments of the present inventive concepts.

More specifically, in some embodiments, the power rails 510 and 560 may be formed at the uppermost part and the lowermost part, respectively, of a standard cell SC of the multiplexer according to example embodiments. Each of the power rails 510 and 560 may be used as VDD or VSS. In some embodiments, the power rail 510 at the uppermost part of the standard cell SC may be used as VDD and is electrically connected to the sixth contact C6. The power rail 560 at the lowermost part of the standard cell SC may be used as VSS and is electrically connected to the eighth contact C8.

First, second, third, and fourth wires 520, 530, 540, and 550 are sequentially arranged between the power rails 510 and 560. The first, second, third, and fourth wires 520, 530, 540, and 550 may be of the same scale and may be spaced apart from one another by the same distance. The first, second, third, and fourth wires 520, 530, 540, and 550 may be provided as unidirectional wires extending only in the first direction X and may be arranged in parallel to one another. In some embodiments, each of the first, second, third, and fourth wires 520, 530, 540, and 550 may have a line shape that extends longitudinally in the first direction as illustrated in FIG. 14.

The first, second, third, and fourth wires 520, 530, 540, and 550 may be formed to have the same width in the first direction X. In some example embodiments, the width of the first, second, third, and fourth wires 520, 530, 540, and 550 in the second direction Y may be the same as the distance between two adjacent ones of the first, second, third, and fourth wires 520, 530, 540, and 550 in the second direction Y. For example, the width of the first wire 520 in the second direction Y may be the same as the distance between the first and second wires 520 and 530 in the second direction Y, but the present inventive concepts are not limited thereto.

A fifth wire 545 may be disposed on the same line as the third wire 540 and may extend in the same direction as the third wire 540. In some embodiments, both the fifth wire 545 and the third wire 540 may be on an imaginary line that extends in the first direction X as illustrated in FIG. 14. A sixth wire 555 may be disposed on the same line as the fourth wire 550 and may extend in the same direction as the fourth wire 550. In some embodiments, both the sixth wire 555 and the fourth wire 550 may be on an imaginary line that extends in the first direction X as illustrated in FIG. 14. That is, the fifth and sixth wires 545 and 555 may be provided as unidirectional wires extending only in the first direction X and may be arranged in parallel to the first, second, third, and fourth wires 520, 530, 540, and 550. In some embodiments, each of the fifth and sixth wires 545 and 555 may have a line shape that extends longitudinally in the first direction as illustrated in FIG. 14.

For example, the first wire 520 may be electrically connected to the first contact C1. That is, the first wire 520 may be electrically connected to the output terminal Y. For example, the second wire 530 may be electrically connected to the second and fourth gate structures G2 and G4. That is, the second wire 530 may be electrically connected to the inverted selection signal nS0. For example, the third wire 540 may be electrically connected to the third gate structure G3. That is, the third wire 540 may be electrically connected to the selection signal S0. For example, the fourth wire 550 may be electrically connected to the cross gate contact CGC2. That is, the fourth wire 550 may be electrically connected to the node A. For example, the fifth wire 545 may be electrically connected to the fifth gate structure G5. That is, the fifth wire 545 may be electrically connected to the node B. For example, the sixth wire 555 may be electrically connected to the fourth contact C4. That is, the sixth wire 555 may be electrically connected to the output terminal Y. However, the present inventive concepts are not limited to these examples.

The wires and the contacts of the first wiring structure may be electrically connected using via contacts (e.g., V31, V32, V33, V34, V35, V36, V37 and V38). For example, referring to FIG. 15, the first wire 520 may be electrically connected to the first contact C1 via a thirty first via contact V31. However, the present inventive concepts are not limited to this example.

The first wiring structure of the semiconductor device according to example embodiments, which includes wires extending unidirectionally and in parallel to one another, may form a standard cell with a low cell height and may secure wide power rails. Accordingly, EM may be reduced, the integration density of a standard cell may be increased, and thus, the semiconductor device according to example embodiments may be applicable to sophisticated processing.

Figure 16:
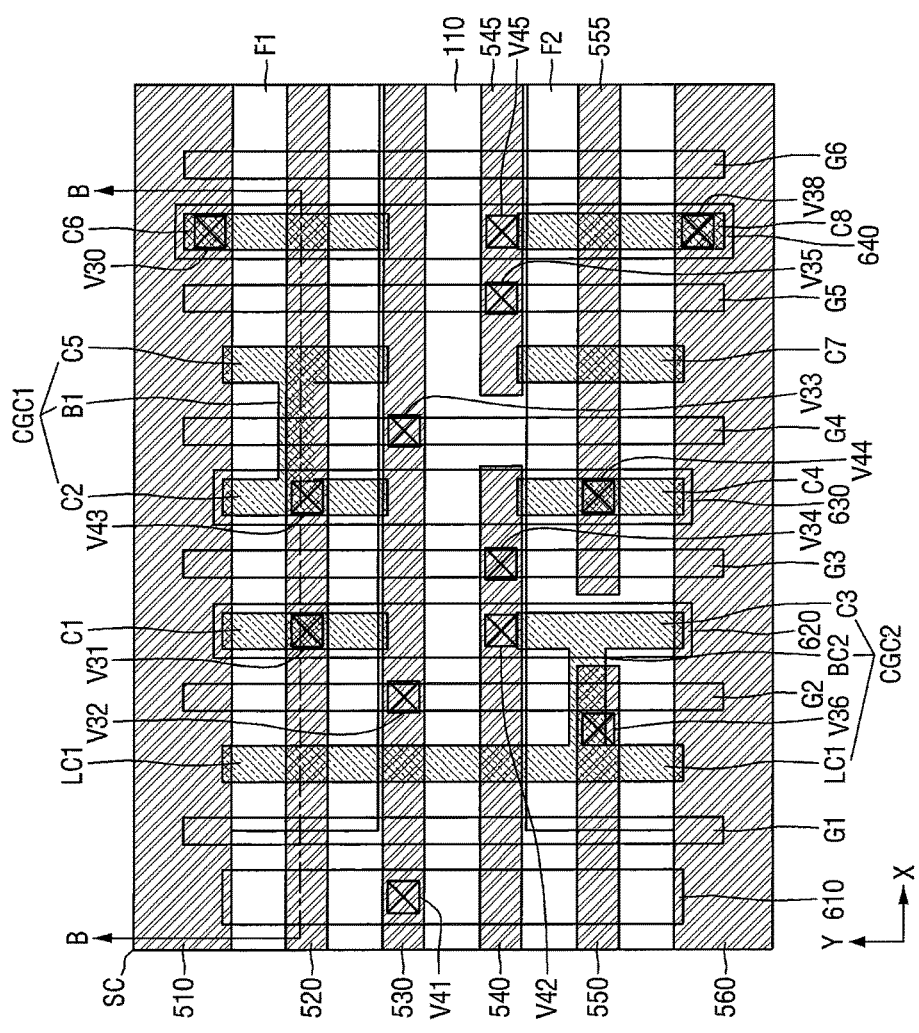
FIG. 16 is a layout view of second-stage metal wiring of a semiconductor device according to example embodiments of the present inventive concepts.
Figure 17:
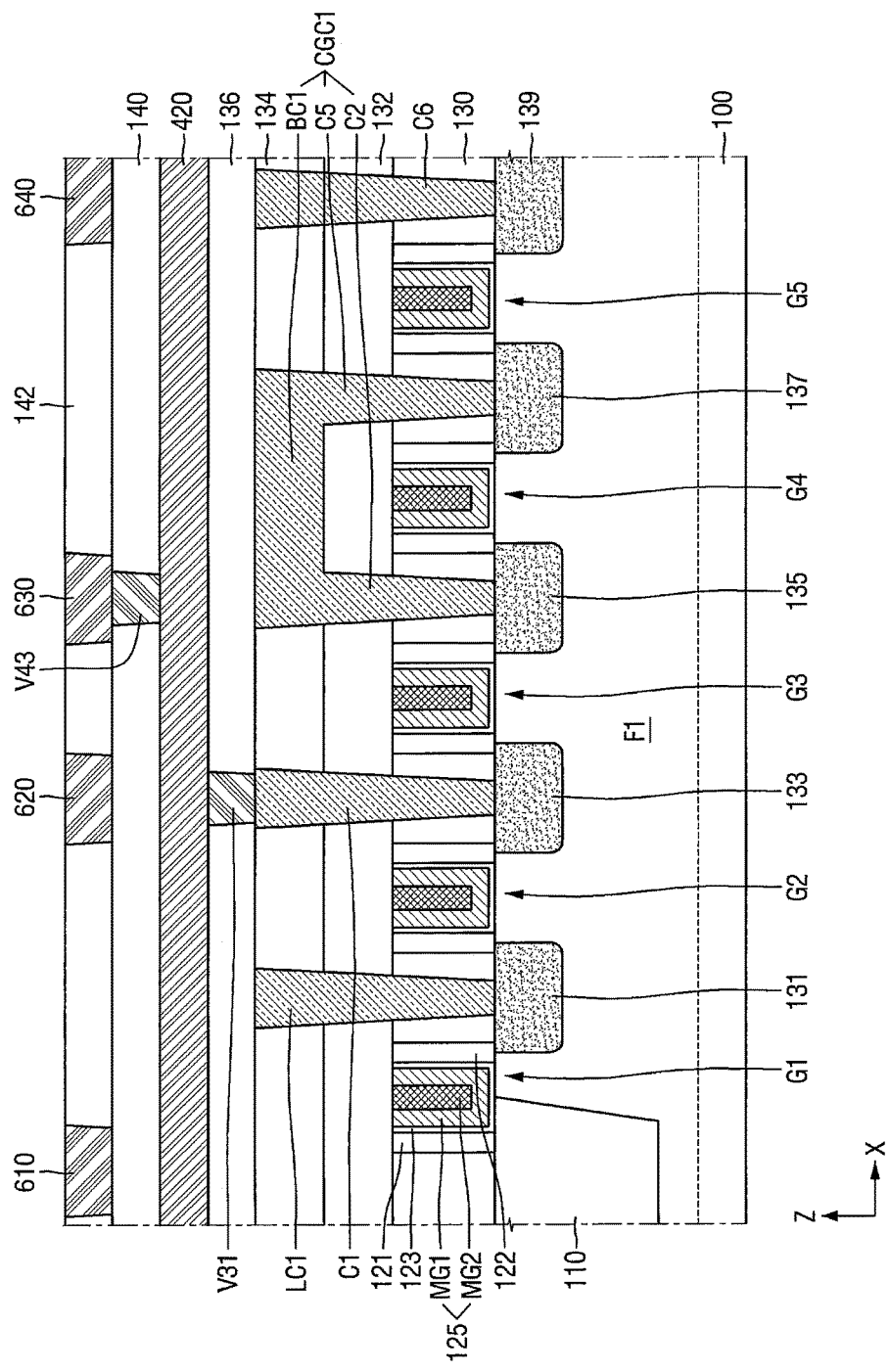
FIG. 17 is a cross-sectional view taken along the line B-B of FIG. 16.

FIG. 16 is a layout view of second-stage metal wiring of a semiconductor device according to example embodiments of the present inventive concepts. FIG. 17 is a cross-sectional view taken along the line B-B of FIG. 16.

Referring to FIGS. 16 and 17, a second wiring structure, which corresponds to a second BEOL level M2, may be formed on the first wiring structure including the power rails 510 and 560 and the first, second, third, fourth, fifth, and sixth wires 520, 530, 540, 550, 545, and 555.

More specifically, the second wiring structure may include seventh, eighth, ninth, and tenth wires 610, 620, 630, and 640. The seventh, eighth, ninth, and tenth wires 610, 620, 630, and 640 may extend unidirectionally in the second direction Y and may be arranged in parallel to one another. The seventh, eighth, ninth, and tenth wires 610, 620, 630, and 640 may be disposed on the same plane. In some embodiments, each of the seventh, eighth, ninth, and tenth wires 610, 620, 630, and 640 may have a line shape that extends longitudinally in the second direction Y as illustrated in FIG. 16. In some embodiments, lowermost surfaces of the seventh, eighth, ninth, and tenth wires 610, 620, 630, and 640 may be in the same plane.

For example, the seventh wire 610 may be electrically connected to the second wire 530. That is, the seventh wire 610 may be electrically connected to the inverted selection signal nS0. For example, the eighth wire 620 may be electrically connected to the third wire 540. That is, the eighth wire 620 may be electrically connected to the selection signal S0. For example, the ninth wire 630 may be electrically connected to the first and sixth third wires 520 and 555. That is, the ninth wire 630 may be electrically connected to the output terminal Y. For example, the tenth wire 640 may be electrically connected to the fifth wire 545. That is, the tenth wire 640 may be electrically connected to the node B. However, the present inventive concepts are not limited to these examples. The wires and the contacts of the second wiring structure may be electrically connected using via contacts (e.g., V41, V42, V43, V44, and V45).

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit (IC) device comprising:
   a first active region extending in a first direction over a substrate;
   first and second gate electrodes extending in a second direction and traversing the first active region, the first and second gate electrodes being spaced apart from each other;
   a first impurity region in the first active region adjacent a first side of the first gate electrode;
   a second impurity region in the first active region between a second side of the first gate electrode that is opposite the first side of the first gate electrode and a first side of the second gate electrode, wherein the second impurity region is a source/drain region of both of the first and second gate electrodes;
   a third impurity region in the first active region adjacent a second side of the second gate electrode that is opposite the first side of the second gate electrode;
   a cross gate contact electrically connecting the first and second impurity regions and extending across the first gate electrode;
   a first contact electrically connected to the third impurity region;
   a first wire electrically connected to the cross gate contact and having a line shape extending longitudinally in the first direction; and
   a second wire electrically connected to the first contact and having a line shape extending longitudinally in the first direction, the first wire and the second wire being on an imaginary line extending in the first direction.

2. The IC device of claim 1, wherein the cross gate contact includes a first sub-contact, which is connected to the first impurity region, a second sub-contact, which is connected to the second impurity region, and a bridge pattern, which connects the first and second sub-contacts.

3. The IC device of claim 2, wherein the cross gate contact has a unitary structure.

4. The IC device of claim 2, further comprising:
a second active region extending in the first direction over the substrate and being spaced apart from the first active region; and
a fourth impurity region in the second active region adjacent the first side of the first gate electrode,
wherein the first sub-contact has a line shape extending longitudinally in the second direction and is connected to the first and fourth impurity regions.

5. The IC device of claim 1, wherein a width of the first wire in the second direction is equal to a width of the second wire in the second direction.

6. The IC device of claim 1, wherein top surfaces of the cross gate contact and the first contact are coplanar.

7. The IC device of claim 1, further comprising:
a third wire electrically connected to the first gate electrode and spaced apart from the first and second wires, the third wire having a line shape extending longitudinally in the first direction; and
a fourth wire electrically connected to the second gate electrode and spaced apart from the first, second and third wires, the fourth wire having a line shape extending longitudinally in the first direction.

8. The IC device of claim 7, wherein the first, third, and fourth wires are spaced apart from each other by an equal interval.

9. An integrated circuit (IC) device comprising:
first and second active regions extending in a first direction over a substrate and being spaced apart from each other in a second direction, which traverses the first direction;
a first gate electrode extending in the second direction;
a first impurity region in the first active region adjacent a first side of the first gate electrode;
a second impurity region in the first active region adjacent a second side of the first gate electrode that is opposite the first side of the first gate electrode;
a third impurity region in the second active region adjacent the first side of the first gate electrode; and
a cross gate contact electrically connecting the first and second impurity regions and extending across the first gate electrode,
wherein the cross gate contact includes a first sub-contact, which extends in the second direction and is connected to the first and third impurity regions, a second sub-contact, which is connected to the second impurity region, and a bridge pattern, which traverses the first gate electrode and connects the first and second sub-contacts.

10. The IC device of claim 9, further comprising:
a fourth impurity region in the second active region adjacent the second side of the first gate electrode;
a first contact connected to the fourth impurity region;
a first wire that is electrically connected to the cross gate contact and has a line shape extending longitudinally in the first direction; and
a second wire that is electrically connected to the first contact and has a line shape extending longitudinally in the first direction.

11. The IC device of claim 10, wherein the second sub-contact and the first contact extend only in the second direction and are on an imaginary line extending in the second direction.

12. The IC device of claim 9, wherein the first and second active regions comprise different types of impurities.

13. An integrated circuit (IC) device comprising:
a first active region on a substrate;
a first gate electrode and a second gate electrode traversing the first active region and extending parallel to each other, the first gate electrode comprising a first side and a second side that is opposite the first side, the second gate electrode comprising a third side and a fourth side that is opposite the third side, and the second side of the first gate electrode facing the third side of the second gate electrode;
a first source/drain region in the first active region adjacent the first side of the first gate electrode, a second source/drain region in the first active region adjacent the second side of the first gate electrode and adjacent the third side of the second gate electrode, and a third source/drain region in the first active region adjacent the fourth side of the second gate electrode;
an interlayer dielectric layer on the first and second gate electrodes and the first, second and third source/drain regions;
a first contact extending through the interlayer dielectric layer and being electrically connected to the first source/drain region; and
a cross gate contact electrically connected to both the second source/drain region and the third source/drain region, an upper surface of the cross gate contact being coplanar with an upper surface of the first contact.

14. The IC device of claim 13, wherein the cross gate contact has a unitary structure.

15. The IC device of claim 13, wherein the cross gate contact comprises a first sub-contact that extends through the interlayer dielectric layer and directly contacts the second source/drain region, a second sub-contact that extends through the interlayer dielectric layer and directly contacts the third source/drain region and a bridge pattern that traverses the second gate electrode and connects the first sub-contact and the second sub-contact, and
wherein an upper surface of the bridge pattern of the cross gate contact is coplanar with the upper surface of the first contact.

16. The IC device of claim 15, further comprising:
a second active region on the substrate, the second active region extending parallel to the first active region, the first and second gate electrodes traversing the second active region; and
a fourth source/drain region in the second active region adjacent the fourth side of the second gate electrode,
wherein the second sub-contact of the cross gate contact extends parallel to the second gate electrode, overlaps the second active region in plan view and is electrically connected to the fourth source/drain region.

17. The IC device of claim 16, further comprising:
a fifth source/drain region in the second active region adjacent the second side of the first gate electrode and adjacent the third side of the second gate electrode; and
a second contact extending through the interlayer dielectric layer and being electrically connected to the fifth source/drain region,
wherein the second contact is spaced apart from the first sub-contact of the cross gate contact.

18. The IC device of claim 13, wherein the interlayer dielectric layer comprises a first interlayer dielectric layer, and the first active region extends in a first direction,
wherein the IC device further comprises:
a second interlayer dielectric layer on the first interlayer dielectric layer, the first contact and the cross gate contact;
a first wire on the second interlayer dielectric layer;
a first via extending through the second interlayer dielectric layer and connecting the first wire to the first contact;
a second wire on the second interlayer dielectric layer; and
a second via extending through the second interlayer dielectric layer and connecting the second wire to the cross gate contact,
wherein each of the first and second wires has a line shape extending longitudinally in the first direction.

19. The IC device of claim 18, further comprising:
a third wire on the second interlayer dielectric layer and electrically connected to the second gate electrode; and
a fourth wire on the second interlayer dielectric layer and electrically connected to the first gate electrode,
wherein each of the third and fourth wires has a line shape extending longitudinally in the first direction.

20. The IC device of claim 19, wherein the first and second gate electrodes extend in a second direction,
wherein the second, third and fourth wires are arranged along the second direction and are spaced apart from each other by an equal interval, and
wherein widths of the second, third and fourth wires in the second direction are equal.

\* \* \* \* \*